(12) United States Patent
Matsuura et al.

(10) Patent No.: US 7,956,699 B2
(45) Date of Patent: Jun. 7, 2011

(54) FREQUENCY MODULATOR AND METHOD FOR ADJUSTING GAIN THEREOF

(75) Inventors: Toru Matsuura, Osaka (JP); Wayne S. Lee, San Mateo, CA (US)

(73) Assignee: Panasonic Corporation, Osaka (JP)

( * ) Notice: Subject to any disclaimer, the term of this patent is extended or adjusted under 35 U.S.C. 154(b) by 182 days.

(21) Appl. No.: 12/505,424

(22) Filed: Jul. 17, 2009

(65) Prior Publication Data
US 2011/0012688 A1 Jan. 20, 2011

(51) Int. Cl.
*H03C 3/06* (2006.01)
(52) U.S. Cl. ......................................... 332/126; 332/127
(58) Field of Classification Search .................. 332/123, 332/126–128; 331/1 A, 8, 10–12, 16–18, 331/25; 327/156–159; 360/51; 375/300, 375/376; 455/42, 75, 110, 112, 113, 260
See application file for complete search history.

(56) References Cited

U.S. PATENT DOCUMENTS 4,870,384 A * 9/1989 Thomas ........................ 332/123
5,952,895 A 9/1999 McCune, Jr. et al.

FOREIGN PATENT DOCUMENTS
WO 96/33553 10/1996

* cited by examiner

*Primary Examiner* — David Mis

(57) ABSTRACT

A frequency modulator capable of performing frequency modulation without increasing quantization noise; and a method for adjusting the gain thereof are provided. An input signal is gain-adjusted by a gain adjustment section and outputted to a frequency modulation section. The frequency modulation section is gain-controlled based on a first signal. For setting a digital gain coefficient and an analog gain coefficient of the gain adjustment section, a test signal is inputted. In this state, in a generation section, first control information for setting the digital gain coefficient and second control information for setting the analog gain coefficient are generated based on information regarding a state of the frequency modulation section.

18 Claims, 19 Drawing Sheets

| OUTPUT FREQUENCY WIDTH $f_1$ | ANALOG GAIN COEFFICIENT |
|---|---|
| $4f_0 \leqq f_1 < 8f_0$ | 1/16 |
| $2f_0 \leqq f_1 < 4f_0$ | 1/8 |
| $f_0 \leqq f_1 < 2f_0$ | 1/4 |
| $f_0/2 \leqq f_1 < f_0$ | 1/2 |
| $f_0/4 \leqq f_1 < f_0/2$ | 1 |

CASE OF TEPERATURE OF $T_0$ —34

| OSCILLATION BAND | ANALOG GAIN COEFFICIENT |
|---|---|
| #1 | 1 |
| #2 | 1/2 |
| #3 | 1/4 |
| #4 | 1/8 |

(B)

CASE OF TEPERATURE OF $T_1$ —35

| OSCILLATION BAND | ANALOG GAIN COEFFICIENT |
|---|---|
| #1 | 1/2 |
| #2 | 1/4 |
| #3 | 1/8 |
| #4 | 1/16 |

FREQUENCY MODULATOR AND METHOD FOR ADJUSTING GAIN THEREOF

BACKGROUND OF THE INVENTION

1. Field of the Invention

The present invention relates to a frequency modulator that includes a voltage controlled oscillator for frequency-modulating an input signal and outputting a frequency-modulated signal, and a method for adjusting the gain thereof.

2. Description of the Background Art

Communication apparatuses such as mobile phones and wireless LAN devices are required to operate with low power consumption while ensuring the accuracy of an output signal. Thus, such communication apparatuses need to be equipped with a frequency modulator that is capable of outputting, as an output signal, an RF phase-modulated signal with low distortion. The following will describe a conventional frequency modulator.

As a conventional frequency modulator, there is known a frequency modulator 100 that is disclosed in International Publication WO 96/33553. FIG. 19 shows a configuration of the conventional frequency modulator 100. In the frequency modulator 100, an inputted modulation signal is band-limited to a specific frequency range by the band limiter 101, and inputted to a buffer 102. The modulation signal inputted to the buffer 102 is inputted to a high frequency circuit 103 for modulating the modulation signal with a high frequency component and a low frequency circuit 104 for modulating the modulation signal with a low frequency component. A voltage controlled oscillator (VCO) 105 adds the modulation signals outputted from the high frequency circuit 103 and the low frequency circuit 104, and outputs an output signal having a frequency according to the voltages of the added modulation signals.

In the low frequency circuit 104, a reference frequency signal is generated by a temperature compensated crystal oscillator (TCXO) 107. The reference frequency signal is divided down to a lower frequency by a frequency counter 108. A phase detector 109 outputs a voltage signal proportional to the phase difference between the reference frequency of the reference frequency signal outputted from the frequency counter 108 and the output signal of the VCO 105 that is fed back by a frequency counter 111. A loop filter 110 filters out all frequency components of the voltage signal, which is outputted from the phase detector 109, below the cut-off frequency thereof, and outputs the filtered signal to the VCO 105.

The high frequency circuit 103 includes a buffer 113 and a variable gain amplifier 114. The variable gain amplifier 114 adjusts the magnitude of an output signal from the buffer 113, and outputs the output signal to the VCO 105. Thus, the gain between the modulation signal inputted to the VCO 105 through the low frequency circuit 104 and the modulation signal inputted to the VCO 105 through the high frequency circuit 103 is balanced.

When the gain of the VCO 105 is great, the gain of the VCO 105 can be kept constant by reducing the gain of the variable gain amplifier 114. Here, it is assumed that the variable gain amplifier 114 adjusts the gain of a modulation signal during a digital signal process and the effective number of bits is 10 bits. When the gain of such a variable gain amplifier 114 is reduced to ½ and further to ¼, the effective number of bits also decreases to 9 bits and further to 8 bits. Thus, a sufficient effective number of bits of the variable gain amplifier 114 cannot be ensured, for example, only 8 bits are useable even though there is originally a digital region of 10 bits. This results in a problem that quantization noise increases.

SUMMARY OF THE INVENTION

Therefore, an object of the present invention is to provide a frequency modulator capable of performing frequency modulation without increasing quantization noise, and a method for adjusting the gain thereof.

To solve the problem mentioned above, an aspect of the present invention is a frequency modulator for frequency-modulating an input signal and outputting a frequency-modulated signal. The frequency modulator comprises a signal selection section, a frequency modulation section, a generation section, and a gain adjustment section. The signal selection section selectively outputs the input signal or a test signal. The frequency modulation section frequency-modulates the input signal and outputs the frequency-modulated signal. The generation section generates, based on information regarding a state of the frequency modulation section and the test signal, first control information for specifying a digital gain coefficient and second control information for specifying an analog gain coefficient. The gain adjustment section controls the gain of the frequency modulation section in accordance with the digital gain coefficient specified by the first control information and the analog gain coefficient specified by the second control information.

In the frequency modulation section, frequency modulation is performed based on the input signal inputted from the signal selection section. By adjusting the digital gain and the analog gain of the gain adjustment section, the gain of the frequency modulation section is controlled. In the frequency modulator of the present invention, prior to the frequency modulation process based on the input signal, the first control information and the second control information are generated based on the information regarding the state of the frequency modulation section, and the digital gain coefficient and the analog gain coefficient of the gain adjustment section are set. Examples of the information regarding the state of the voltage controlled oscillator includes the output frequency of the frequency-modulated signal that is detected by the frequency detector, information indicative of an oscillation band of the frequency modulation section, the temperature of the frequency modulation section, and the like.

In the frequency modulator of the present invention, gain adjustment in accordance with the digital gain coefficient specified by the first control information and gain adjustment in accordance with the analog gain coefficient specified by the second control information is performed in the gain adjustment section. Thus, when the gain of the frequency modulation section is great, the analog gain coefficient specified by the second control information should be reduced in order to keep the gain of the frequency modulation section constant. This eliminates a need to reduce the digital gain coefficient specified by the first control information, and hence a reduction in the effective number of bits of the digital gain can be prevented. Therefore, the input signal can be frequency-modulated without increasing quantization noise.

In another aspect, the signal selection section includes: a test signal generation section for generating the test signal; and a first selection section for selectively outputting the input signal or the test signal generated by the test signal generation section.

In another aspect, the signal selection section outputs the input signal to both the frequency modulation section and the gain adjustment section. The gain adjustment section includes a variable digital gain adjuster, a digital/analog converter, and a variable analog gain adjuster. The variable digital gain adjuster gain-adjusts the input signal in accordance with the digital gain coefficient specified by the first control information. The digital/analog converter converts, into an analog signal, the input signal gain-adjusted by the variable digital gain adjuster. The variable analog gain adjuster gain-adjusts, in accordance with the analog gain coefficient specified by the second control information, the analog signal converted by the digital/analog converter, and outputs the analog signal to the frequency modulation section.

In another aspect, the signal selection section outputs the input signal to both the frequency modulation section and the gain adjustment section, and the gain adjustment section gain-adjusts the input signal in accordance with the digital gain coefficient specified by the first control information and the analog gain coefficient specified by the second control information, and outputs the input signal as a first signal to the frequency modulation section. The frequency modulation section includes a voltage controlled oscillator, a frequency detector, a subtractor, and a loop filter. The voltage controlled oscillator controls an oscillatory frequency thereof in accordance with the first signal and a second signal to frequency-modulate the input signal and output the frequency-modulated signal. The frequency detector detects the output frequency of the frequency-modulated signal. The subtractor generates an error signal representing the difference between the frequency of the input signal and the output frequency. The loop filter suppresses a high-frequency component of the error signal and outputs the error signal as the second signal.

In another aspect, the generation section includes a first storage section, a second selection section, and a calculation section. The first storage section stores a constant. The second selection section outputs the error signal, which is processed by the loop filter, as the second signal when the input signal is inputted to the gain adjustment section. The second selection section also reads the constant from the first storage section and outputs the constant as the second signal when the test signal is inputted to the gain adjustment section. When the test signal is inputted to the gain adjustment section and the constant is inputted to the voltage controlled oscillator, the calculation section generates the first control information and the second control information based on the frequency width of the output frequency detected by the frequency detector. The calculation section generates the second control information such that the analog gain coefficient specified by the second control information is changed in accordance with the magnitude of the frequency width of the output frequency.

For example, when the frequency width of the output frequency is equal to or greater than the frequency width of the test signal and less than twice the frequency width of the test signal, the second control information is generated such that the analog gain coefficient is set to ¼. Further, for example, when the frequency width of the output frequency is equal to or greater than twice the frequency width of the test signal and less than four times the frequency width of the test signal, the second control information is generated such that the analog gain coefficient is set to ⅛. As described above, the analog gain coefficient is changed as appropriate depending on the magnitude of the frequency width of the output frequency. Thus, by setting, to an appropriate value, a threshold value for changing the analog gain coefficient, it is possible to easily set the analog gain coefficient of the gain adjustment section to an appropriate value.

In another aspect, prior to a process of generating the first control information, the calculation section temporarily sets the digital gain coefficient, which is specified by the first control information, to a predetermined value, and generates the second control information.

According to the above configuration, the digital gain coefficient of the gain adjustment section is set after the analog gain coefficient of the gain adjustment section is set. Thus, even when the analog gain coefficient is not set to an appropriate value due to a temperature change or the like, this can be compensated by the digital gain coefficient specified by the first control information.

In another aspect, the calculation section generates the first control information based on the frequency width of the test signal, the frequency width of the output frequency detected by the frequency detector, and the predetermined value.

In another aspect, the voltage controlled oscillator is capable of switching an oscillation band of the oscillatory frequency. In this case, the generation section includes a first storage section, a second selection section, a second storage section, and a calculation section. The first storage section stores a constant. The second selection section outputs the error signal, which is processed by the loop filter, as the second signal when the input signal is inputted to the gain adjustment section. The second selection section also reads the constant from the first storage section and outputs the constant as the second signal when the test signal is inputted to the gain adjustment section. The second storage section stores analog gain information in which oscillation bands selectable by the voltage controlled oscillator are associated with analog gain coefficients, respectively. When the test signal is inputted to the gain adjustment section and the constant is inputted to the voltage controlled oscillator, the calculation section generates the first control information and the second control information based on the information regarding the state of the frequency modulation section. The calculation section reads, from the second storage section, an analog gain coefficient associated with an oscillation band that is currently selected by the voltage controlled oscillator, and generates the second control information for specifying this analog gain coefficient.

By the oscillation band being switched, the gain of the voltage controlled oscillator changes. Thus, by the analog gain information being set such that a gain change of the voltage controlled oscillator with a change in the oscillation band is suppressed, it is possible to easily suppress the gain change of the voltage controlled oscillator.

In another aspect, the generation section includes a temperature detection section for detecting the temperature of the voltage controlled oscillator. In this case, the second storage section stores the analog gain information per temperature; and the calculation section reads, from the second storage section, an analog gain coefficient that is associated with the temperature detected by the temperature detection section and associated with the oscillation band that is currently selected by the voltage controlled oscillator, and generates the second control information for specifying this analog gain coefficient.

According to the above configuration, it is possible to set the analog gain coefficient of the gain adjustment section to an appropriate value even when a characteristic of the voltage controlled oscillator changes due to a temperature change.

In another aspect, the calculation section generates the second control information prior to a process of generating the first control information.

According to the above configuration, the digital gain coefficient of the gain adjustment section is set after the analog gain coefficient of the gain adjustment section. Thus, even when the analog gain coefficient is not set to an appropriate value due to a temperature change or the like, this can be compensated by gain adjustment in accordance with the digital gain coefficient specified by the first control information.

In another aspect, the calculation section generates the first control information based on the frequency width of the test signal and the frequency width of the output frequency detected by the frequency detector.

In another aspect, the generation section includes a first storage section, a second selection section, and a calculation section. The first storage section stores a constant. The second selection section outputs the error signal, which is processed by the loop filter, as the second signal when the input signal is inputted to the gain adjustment section. The second selection section also reads the constant from the first storage section and outputs the constant as the second signal when the test signal is inputted to the gain adjustment section. When the test signal is inputted to the gain adjustment section and the constant is inputted to the voltage controlled oscillator, the calculation section generates the first control information and the second control information based on the information regarding the state of the frequency modulation section. The calculation section generates the first control information and the second control information by substituting the frequency width of the output frequency, which is detected by the frequency detector, into a predetermined arithmetic expression including a digital gain coefficient and an analog gain coefficient as variables.

According to the above configuration, it is possible to generate the first control information and the second control information easily and rapidly.

In another aspect, the calculation section performs a first process and a second process. The first process is a process of temporarily setting the digital gain coefficient of the gain adjustment section to a first initial gain coefficient and temporarily setting the analog gain coefficient of the gain adjustment section to a second initial gain coefficient, before the test signal is inputted to the gain adjustment section and the constant is inputted to the voltage controlled oscillator. The second process is a process of substituting the first initial gain coefficient, the second initial gain coefficient, the frequency width of the test signal, and the frequency width of the output frequency, which is detected by the frequency detector, into the predetermined arithmetic expression to generate the first control information and the second control information, after the test signal is inputted to the gain adjustment section and the constant is inputted to the voltage controlled oscillator.

In another aspect, in the second process, the calculation section selects a combination of a digital gain coefficient and an analog gain coefficient that provides the minimum analog gain coefficient specified by the second control information, among a plurality of combinations of digital gain coefficients and analog gain coefficients that are obtained as solutions of the predetermined arithmetic expression, and generates the first control information and the second control information for specifying the selected analog gain coefficient and the selected digital gain coefficient.

According to the above configuration, it is possible to more effectively prevent a reduction in the digital gain of the frequency modulation section.

Further, an aspect of the present invention is directed to a method for adjusting the gain of a frequency modulator comprising: a frequency modulation section for frequency-modulating an input signal and outputting a frequency-modulated signal; and a gain adjustment section for controlling the gain of the frequency modulation section in accordance with a digital gain coefficient specified by first control information and an analog gain coefficient specified by second control information. The method comprises the steps of: temporarily setting the analog gain coefficient and the digital gain coefficient of the gain adjustment section to predetermined values; generating a first test signal and inputting the first test signal to the gain adjustment section instead of the input signal; detecting an output frequency of the frequency-modulated signal with respect to the first test signal; generating the second control information based on the magnitude of the frequency width of the output frequency; generating a second test signal and inputting the second test signal to the gain adjustment section; detecting an output frequency of the frequency-modulated signal with respect to the second test signal; and generating the first control information based on the frequency width of the second test signal, the frequency width of the output frequency with respect to the second test signal, and the predetermined value of the digital gain coefficient.

Further, an aspect of the present invention is directed to a method for adjusting the gain of a frequency modulator comprising: a frequency modulation section for frequency-modulating an input signal and outputting a frequency-modulated signal, the frequency modulation section being capable of switching an oscillation band of an oscillatory frequency; and a gain adjustment section for controlling the gain of the frequency modulation section in accordance with a digital gain coefficient specified by first control information and an analog gain coefficient specified by second control information. The method comprises the steps of: reading, from a memory, an analog gain coefficient associated with an oscillation band that is currently selected by the frequency modulation section, and generating the second control information for specifying this analog gain coefficient; generating a second test signal and inputting the second test signal to the gain adjustment section instead of the input signal; detecting the output frequency of the frequency-modulated signal; and generating the first control information based on the frequency width of the second test signal and the frequency width of the output frequency.

Further, an aspect of the present invention is directed to a method for adjusting the gain of a frequency modulator comprising: a frequency modulation section for frequency-modulating an input signal and outputting a frequency-modulated signal, the frequency modulation section being capable of switching an oscillation band of an oscillatory frequency; and a gain adjustment section for controlling the gain of the frequency modulation section in accordance with a digital gain coefficient specified by first control information and an analog gain coefficient specified by second control information. The method comprises the steps of: detecting the temperature of the frequency modulation section; reading, from a memory, an analog gain coefficient that is associated with the temperature detected at the detecting step and associated with an oscillation band that is currently selected by the frequency modulation section, and generating the second control information for specifying this analog gain coefficient; generating a second test signal and inputting the second test signal to the gain adjustment section instead of the input signal; detecting the output frequency of the frequency-modulated signal; and generating the first control information based on the frequency width of the second test signal and the frequency width of the output frequency.

Further, an aspect of the present invention is directed to a method for adjusting the gain of a frequency modulator comprising: a frequency modulation section for frequency-modulating an input signal and outputting a frequency-modulated signal; and a gain adjustment section for controlling the gain of the frequency modulation section in accordance with a digital gain coefficient specified by first control information and an analog gain coefficient specified by second control information. The method comprises the steps of: temporarily setting the digital gain coefficient of the gain adjustment section to a first initial gain coefficient, and temporarily setting the analog gain coefficient of the gain adjustment section to a second initial gain coefficient; generating a first test signal and inputting the first test signal to the gain adjustment section instead of the input signal; detecting the output frequency of the frequency-modulated signal; and generating the first control information and the second control information by substituting the first initial gain coefficient, the second initial gain coefficient, the frequency width of the first test signal, and the frequency width of the output frequency into a predetermined arithmetic expression including a digital gain coefficient and an analog gain coefficient as variables.

According to the present invention, when the gain of the frequency modulation section changes considerably, this gain change can be suppressed by gain adjustment in accordance with the analog gain coefficient specified by the second control information. Thus, a reduction in the effective number of bits of the digital gain of the gain adjuster is prevented, and hence the input signal can be frequency-modulated without increasing quantization noise.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 shows look-up tables 34 and 35;

DESCRIPTION OF THE PREFERRED EMBODIMENTS

First Embodiment

Figure 1:
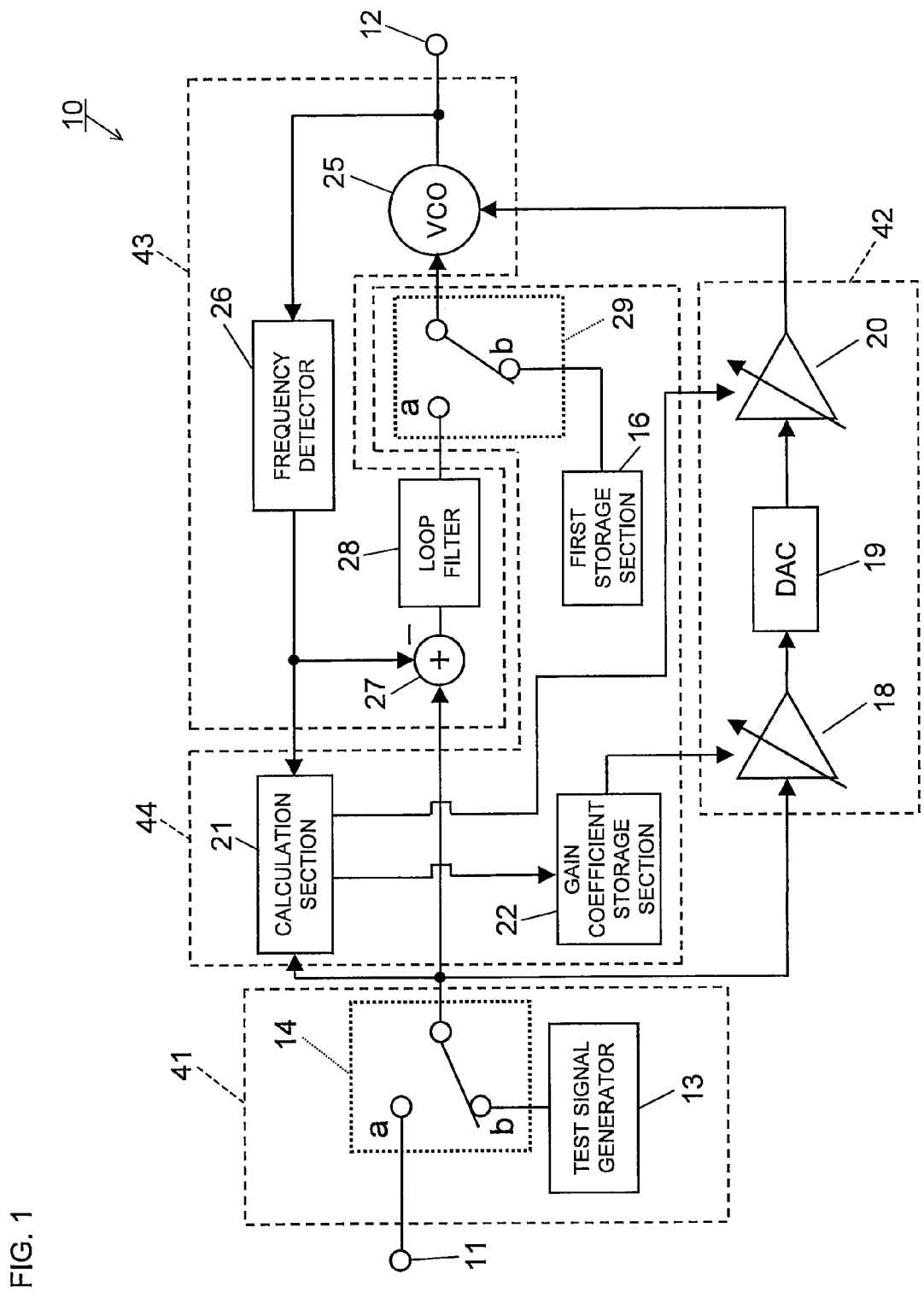
FIG. 1 shows an exemplary configuration of a frequency modulator 10 according to a first embodiment of the present invention.

The following will describe a first embodiment of the present invention with reference to the drawings. FIG. 1 shows an exemplary configuration of a frequency modulator 10 according to the first embodiment of the present invention. The frequency modulator 10 frequency-modulates an input signal (baseband modulation signal) inputted from an input terminal 11, and outputs a frequency-modulated signal from an output terminal 12. As shown in FIG. 1, the frequency modulator 10 includes a signal selection section 41, a gain adjustment section 42, a frequency modulation section 43, and a generation section 44.

Although described later, in the frequency modulator 10, a normal process is performed after an adjustment process is performed. Here, the normal process is a process of frequency-modulating the input signal inputted from the input terminal 11 and outputting the frequency-modulated signal from the output terminal 12. On the other hand, the adjustment process is a process for setting an analog gain coefficient and a digital gain coefficient that are required for the normal process.

First, each component of the frequency modulator 10 will be described schematically.

The signal selection section 41 switches a signal to be outputted to the gain adjustment section 42, the frequency modulation section 43, and the generation section 44, between the normal process and the adjustment process. The signal selection section 41 includes a test signal generator 13 and a first selection section 14.

The test signal generator 13 generates a later-described first test signal (see FIG. 5(A)) and a later-described test pattern signal (see FIG. 8), and operates only during the adjustment process. Here, the first test signal is used for setting an analog gain coefficient for the gain adjustment section 42. The test pattern signal is used for setting a digital gain coefficient for the gain adjustment section 42, and consists of a plurality of second test signals. A process of setting the analog gain coefficient for the gain adjustment section 42 and a process of setting the digital gain coefficient for the gain adjustment section 42 will be described later.

The first selection section 14 selectively outputs the input signal from the input terminal 11 or a signal generated by the test signal generator 13, depending on a process performed by the frequency modulator 10. Specifically, the first selection section 14 outputs the input signal, which is inputted from the input terminal 11, during the normal process, and outputs the signal (the first test signal or the test pattern signal), which is generated by the test signal generator 13, during the adjustment process. As the first selection section 14, for example, a multiplexer is used. By this operation of the first selection section 14, any one of the input signal inputted from the input terminal 11, the first test signal generated by the test signal generator 13, and the test pattern signal generated by test signal generator 13 is outputted to a calculation section 21 of the generation section 44, a subtractor 27 of the frequency modulation section 43, and a variable digital gain adjuster 18 of the gain adjustment section 42.

The frequency modulation section 43 includes a voltage controlled oscillator (hereinafter, referred to as "VCO") 25, a frequency detector 26, the subtractor 27, and a loop filter 28.

Figure 2:
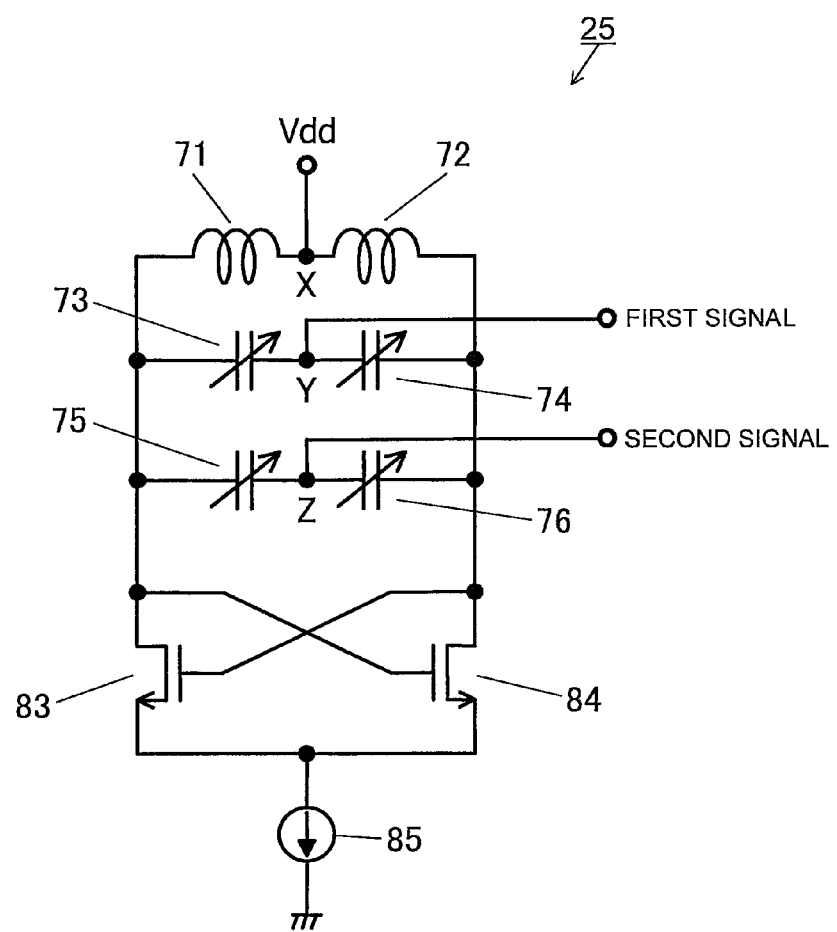
FIG. 2 shows an exemplary configuration of a VCO 25.

FIG. 2 shows an exemplary configuration of the VCO 25. As shown in FIG. 2, the VCO 25 includes inductors 71 and 72, variable capacitance elements 73, 74, 75, and 76, oscillation transistors 83 and 84, and a current source 85.

A constant source voltage Vdd is inputted from an LDO (low dropout regulator), which is not shown in the drawings, to a connection point X between the inductors 71 and 72. A first signal is inputted as a control voltage from the gain adjustment section 42 to a connection point Y between the variable capacitance elements 73 and 74. A second signal is inputted as a control voltage from a second selection section 29 of the generation section 44 to a connection point Z between the variable capacitance elements 75 and 76. The VCO 25 controls an oscillatory frequency thereof in accordance with the first signal and the second signal to output a frequency-modulated signal obtained by frequency-modulating the input signal.

The frequency detector 26 detects the output frequency of the VCO 25, namely, the output frequency of the frequency-modulated signal outputted from the VCO 25. Specifically, the frequency detector 26 digitalizes the frequency-modulated signal outputted from the VCO 25, and decimates the result of the digitalization to a digital loop clock rate of the frequency modulation section 43. The output frequency detected by the frequency detector 26 is outputted to the subtractor 27 and the calculation section 21 of the generation section 44.

The subtractor 27 operates only during the normal process, and generates an error signal representing the difference between the frequency of the input signal inputted from the first selection section 14 and the output frequency detected by the frequency detector 26. Specifically, the subtractor 27 subtracts a signal representing the output frequency detected by the frequency detector 26 from the input signal inputted from the first selection section 14. Thus, the error signal is outputted from the subtractor 27. The loop filter 28 operates only during the normal process similarly to the subtractor 27, and suppresses a high frequency component of the error signal outputted from the subtractor 27. The error signal processed by the loop filter 28 is outputted as the second signal to the VCO 25 through the second selection section 29 of the generation section 44. As the loop filter 28, for example, a low-pass filter is used.

As described above, the subtractor 27, the loop filter 28, the second selection section 29, the VCO 25, and the frequency detector 26 constitute a feedback loop. The operation of the feedback loop during the normal process stabilizes the output frequency of the frequency-modulated signal outputted from the VCO 25. In other words, the frequency modulation section 43 functions as a frequency locked loop (FLL).

In the present embodiment, the generation section 44 includes a first storage section 16, the second selection section 29, the calculation section 21, and a gain coefficient storage section 22. The first storage section 16 stores a constant. The constant is used only during the adjustment process. Although not shown in the drawings, the first storage section 16 is connected to the loop filter 28, and the constant stored in the first storage section 16 is updated with the output of the loop filter 28. The second selection section 29 selectively switches the second signal to be inputted to the VCO 25, depending on whether a process performed by the frequency modulator 10 is the normal process or the adjustment process. Specifically, during the normal process, the second selection section 29 outputs the error signal, which is processed by the loop filter 28, as the second signal to the VCO 25. During the adjustment process, the second selection section 29 reads the constant from the first storage section 16 and outputs the constant as the second signal to the VCO 25.

The calculation section 21 operates only during the adjustment process. The calculation section 21 generates first control information and second control information based on information regarding a state of the VCO 25 of the frequency modulation section 43. Here, the first control information is information for specifying a digital gain coefficient. The second control information is information for specifying an analog gain coefficient. The calculation section 21 outputs the generated first control information to the gain coefficient storage section 22. Thus, the digital gain coefficient is stored in the gain coefficient storage section 22. The first control information is read from the gain coefficient storage section 22 by the variable digital gain adjuster 18. Thus, the digital gain coefficient is set for the variable digital gain adjuster 18. Further, the calculation section 21 outputs the generated second control information to a variable analog gain adjuster 20. Thus, the analog gain coefficient is set for the variable analog gain adjuster 20. In the first embodiment, the information regarding the state of the VCO 25 is the output frequency detected by the frequency detector 26. However, the information regarding the state of the VCO 25 is not limited thereto, and may be other information such as the temperature of the VCO 25. A process of the calculation section 21 will be described later.

In order to control the gain of the VCO 25, the gain adjustment section 42 gain-adjusts the input signal and outputs the gain-adjusted input signal as the first signal to the VCO 25. In the present embodiment, the gain adjustment section 42 includes the variable digital gain adjuster 18, a digital/analog converter (hereinafter, referred to as "DAC") 19, and the variable analog gain adjuster 20.

The variable digital gain adjuster 18 gain-adjusts a signal inputted thereto with the digital gain coefficient specified by the first control information generated by the calculation section 21. In other words, in order to deal with a non-linear response of the VCO 25, the variable digital gain adjuster 18 gain-adjusts (scales) the input signal, which is inputted from the first selection section 14, in accordance with the digital gain coefficient stored in the gain coefficient storage section 22. Specifically, depending on the level of the input signal, the variable digital gain adjuster 18 reads, from the gain coefficient storage section 22, a digital gain coefficient suitable for gain-adjusting the input signal. Then, the variable digital gain adjuster 18 gain-adjusts the input signal in accordance with the read digital gain coefficient. The gain-adjusted input signal is inputted as the second signal to the VCO 25 through the DAC 19 and the variable analog gain adjuster 20. Thus, the non-linear response of the VCO 25 is compensated. A process for obtaining a digital gain coefficient will be described later.

The DAC 19 converts, into an analog signal, the signal gain-adjusted by the variable digital gain adjuster 18. The variable analog gain adjuster 20 gain-adjusts the analog signal, which is D/A-converted by the DAC 19, with the analog gain coefficient according to the second control information. The signal gain-adjusted by the variable analog gain adjuster 20 is outputted as the first signal to the VCO 25.

Figure 3:
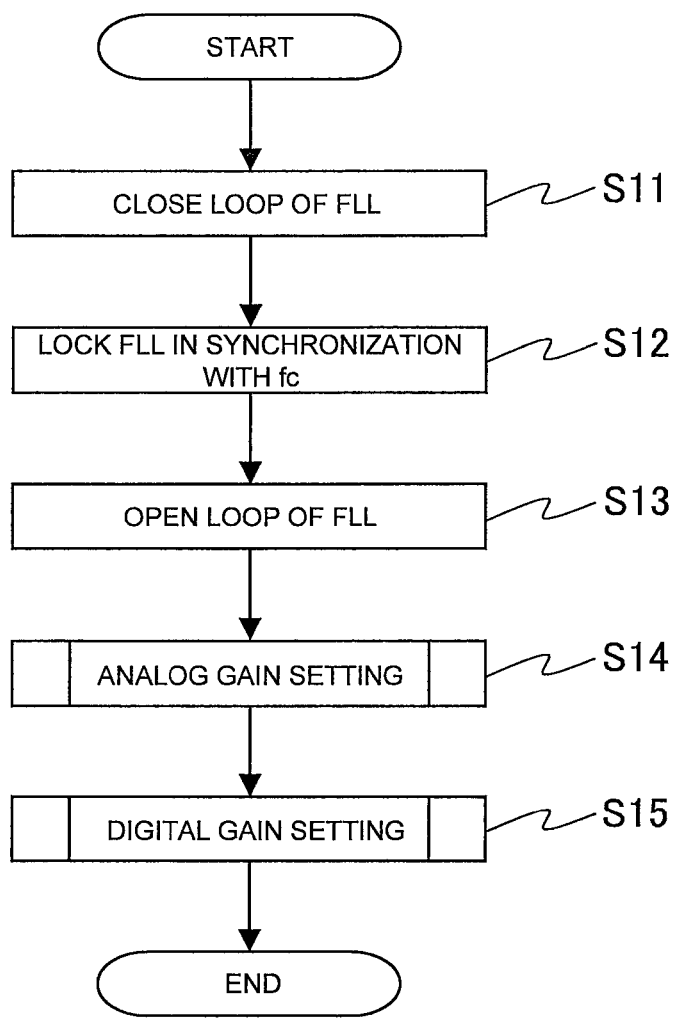
FIG. 3 is a flow chart showing an example of an adjustment process performed by the frequency modulator 10.

The following will describe a procedure of the adjustment process performed by the frequency modulator 10. FIG. 3 is a flow chart showing an example of the adjustment process performed by the frequency modulator 10.

First, the loop of the frequency modulation section 43 (FLL) is closed (step S11). Then, the control input of the VCO 25 is biased such that the frequency modulation section 43 tunes and locks a center frequency $f_C$ (see FIG. 8) centered in a frequency band of interest (step S12). After the frequency modulation section 43 is tuned and locked to the center frequency $f_C$, the second selection section 29 opens the loop of the frequency modulation section 43 (step S13). Specifically, the second selection section 29 outputs the constant, which is stored in the first storage section 16, as the second signal to the VCO 25, instead of the error signal processed by the loop filter 28. The purpose of opening the loop of the frequency modulation section 43 is to prevent a closed-loop feedback effect of the frequency modulation section 43 from canceling the first test signal and the test pattern signal that are added later.

After the loop of the frequency modulation section 43 is opened, the frequency modulator 10 performs an analog gain setting process for setting an analog gain coefficient for the variable analog gain adjuster 20 (step S14). Then, the frequency modulator 10 performs a digital gain setting process for setting a digital gain coefficient for the variable digital gain adjuster 18 (step S15). After the process at step S15 is completed, the frequency modulator 10 starts the normal process of frequency-modulating the input signal inputted from the input terminal 11 and outputting the frequency-modulated signal from the output terminal 12.

Figure 4:
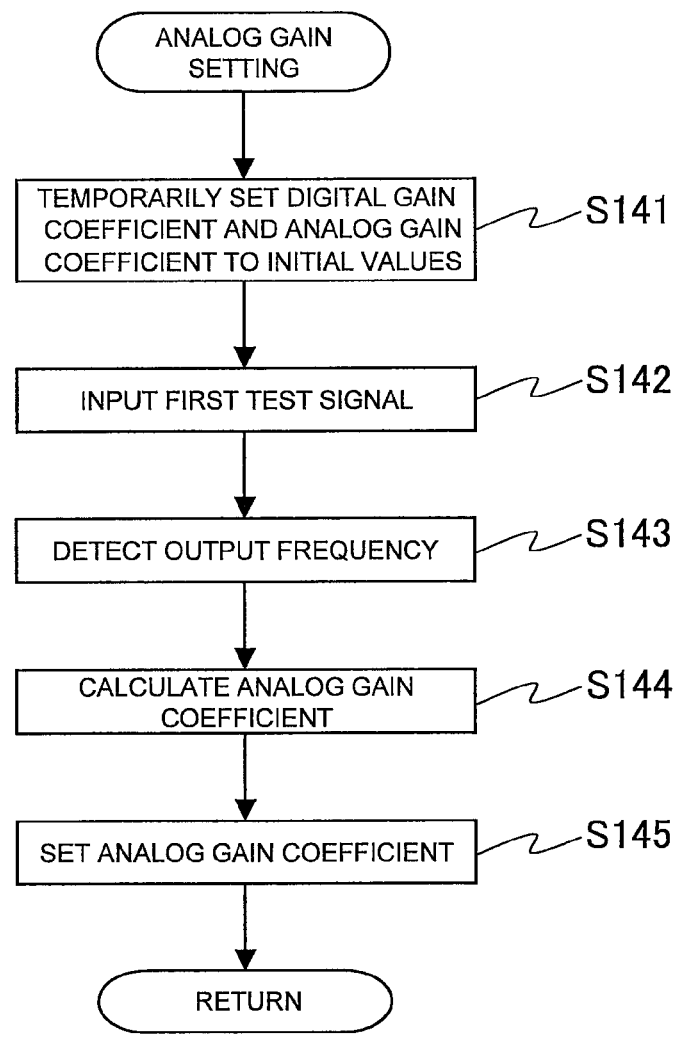
FIG. 4 is a detailed flow chart of an analog gain setting process in FIG. 3.
Figure 5:
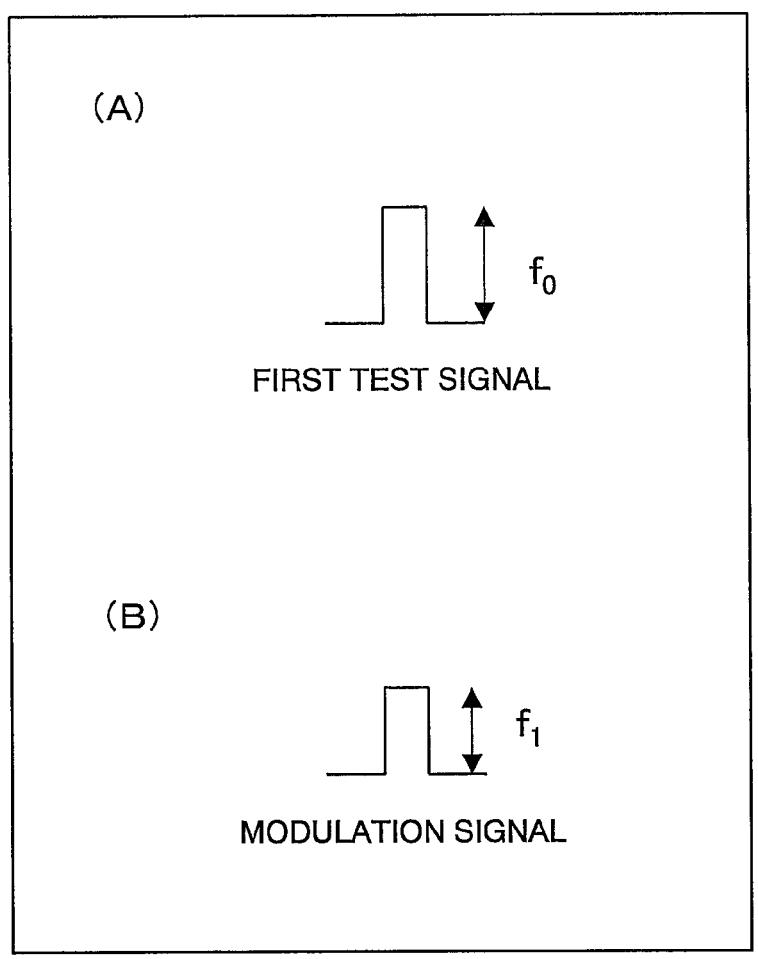
FIG. 5 shows signals inputted to and outputted from the frequency modulator 10.
Figure 6:
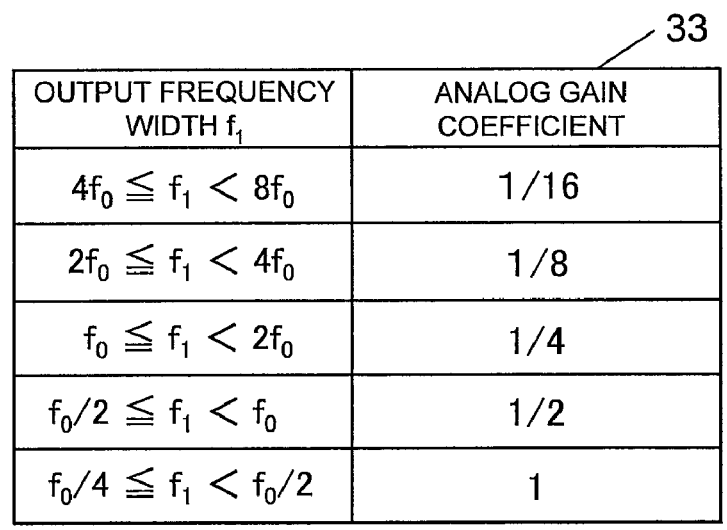
FIG. 6 shows an association between an output frequency width $f_1$ and an analog gain coefficient.

FIG. 4 is a detailed flow chart of the analog gain setting process in FIG. 3. FIG. 5 shows signals inputted to and outputted from the frequency modulator 10 during the adjustment process, (A) shows the first test signal generated by the test signal generator 13, and (B) shows a modulation signal outputted from the VCO 25 when the first test signal is inputted. FIG. 6 shows an association between an output frequency width $f_1$ and an analog gain coefficient. Here, the output frequency width is a frequency width of an output frequency that is calculated by the calculation section 21 based on the output frequency of the VCO 25 detected by the frequency detector 26. With reference to FIGS. 4 to 6, the following will describe the process of setting the analog gain coefficient of the variable analog gain adjuster 20. This analog gain setting process is performed in a state where the first selection section 14 is connected to a terminal b and the second selection section 29 is connected to a terminal b.

As shown in FIG. 4, the calculation section 21 temporarily sets the digital gain coefficient and the analog gain coefficient to initial values, respectively (step S141). Specifically, the calculation section 21 generates a first control signal for specifying a digital gain coefficient $g_0$, and outputs the first control signal to the gain coefficient storage section 22. The first control signal is read from the gain coefficient storage section 22 by the variable digital gain adjuster 18. Further, the calculation section 21 generates second control information for specifying, for example, an analog gain coefficient of "¼", and outputs the second control information to the variable analog gain adjuster 20. Thus, the digital gain coefficient of the variable digital gain adjuster 18 is temporarily set to $g_0$, and the analog gain coefficient of the variable analog gain adjuster 20 is temporarily set to "¼". The analog gain coefficient temporarily set at step S141 is not limited to "¼", and may be, for example, "½" or "⅛".

After the digital gain coefficient and the analog gain coefficient are temporarily set, the first test signal are inputted to the VCO 25 together with a signal indicative of the constant (step S142). Specifically, the second selection section 29 reads the constant stored in the first storage section 16, and outputs the constant as the second signal to the VCO 25. Accordingly, the test signal generator 13 generates, as the first test signal, a predetermined pulse signal (see FIG. 5(A)) with a frequency width of $f_0$, and the first selection section 14 outputs the first test signal to the calculation section 21 and the variable digital gain adjuster 18.

The first test signal is gain-adjusted by the variable digital gain adjuster 18 in accordance with the digital gain coefficient $g_0$ temporarily set at step S141, and then converted by the DAC 19 into an analog signal. The analog signal is gain-adjusted by the variable analog gain adjuster 20 in accordance with the analog gain coefficient of "¼" temporarily set at step S141, and then outputted as the first signal to the VCO 25. Thus, the VCO 25 performs frequency modulation based on the constant inputted from the second selection section 29 and the first test signal gain-adjusted by the variable digital gain adjuster 18 and the variable analog gain adjuster 20.

The modulation signal outputted from the VCO 25 is inputted to the frequency detector 26. The frequency detector 26 detects the output frequency of the modulation signal outputted from the VCO 25 (see FIG. 5(B)) (step S143). The calculation section 21 calculates an output frequency width $f_1$ based on the output frequency detected by the frequency detector 26. Then, the calculation section 21 determines the magnitude of the output frequency width $f_1$ with respect to the frequency width $f_0$ of the first test signal, and calculates an analog gain coefficient (step S144).

As shown in FIG. 6, as a result of the determination, when $f_0 \leq f_1 < 2f_0$, the calculation section 21 generates second control information for specifying an analog gain coefficient of "¼", and outputs the second control information to the variable analog gain adjuster 20. As a result of the determination, when $f_0/2 \leq f_1 < f_0$, the calculation section 21 generates second control information for specifying an analog gain coefficient of "½", and outputs the second control information to the variable analog gain adjuster 20. As a result of the determination, when $f_0/4 \leq f_1 < f_0/2$, the calculation section 21 generates second control information for specifying an analog gain coefficient of "1", and outputs the second control information to the variable analog gain adjuster 20. As a result of the determination, when $2f_0 \leq f_1 < 4f_0$, the calculation section 21 generates second control information for specifying an analog gain coefficient of "⅛", and outputs the second control information to the variable analog gain adjuster 20. As a result of the determination, when $4f_0 \leq f_1 < 8f_0$, the calculation section 21 generates second control information for specifying an analog gain coefficient of "1/16", and outputs the second control information to the variable analog gain adjuster 20.

The calculation section 21 sets the analog gain coefficient calculated in the process at step S144 (step S145). In other words, the calculation section 21 generates second control information for specifying the analog gain coefficient obtained by the calculation, and outputs the generated second control information to the variable analog gain adjuster 20.

As described above, the calculation section 21 generates second control information such that the analog gain coefficient is changed depending on the magnitude of the output frequency width $f_1$ with respect to the magnitude of the frequency width $f_0$ of the first test signal, and outputs the second control information to the variable analog gain adjuster 20. Thus, the analog gain coefficient of the variable analog gain adjuster 20 is set to an appropriate value.

The association between the range of the output frequency width $f_1$ and the analog gain coefficient, which is shown in FIG. 6, is in a case of assuming that a setting range of the digital gain coefficient of the variable digital gain adjuster 18 in the case of the center frequency $f_C$ is from $g_0$ to $2g_0$. The association between the range of the output frequency width $f_1$ and the analog gain coefficient is changed as appropriate depending on the setting range of the variable digital gain adjuster 18.

Figure 7:
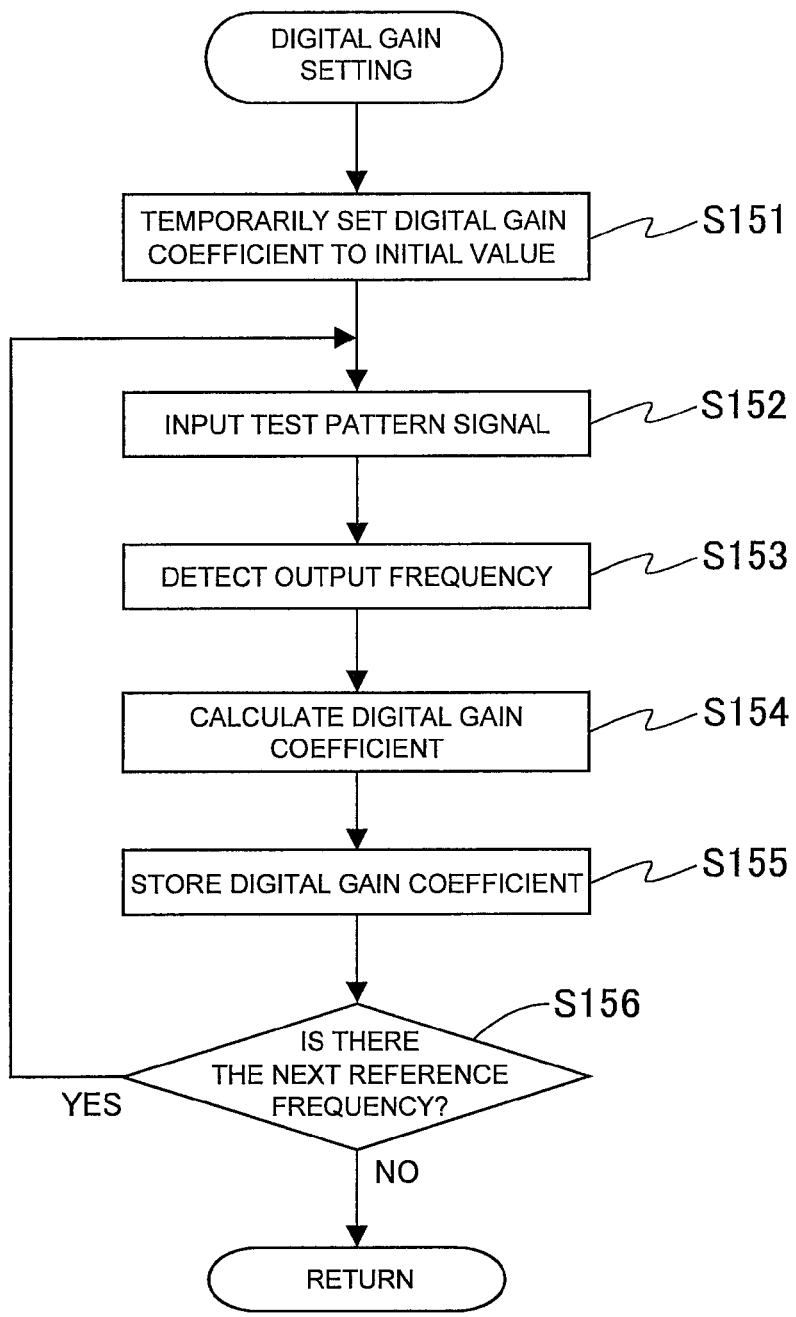
FIG. 7 is a detailed flow chart of a digital gain setting process in FIG. 3.
Figure 8:
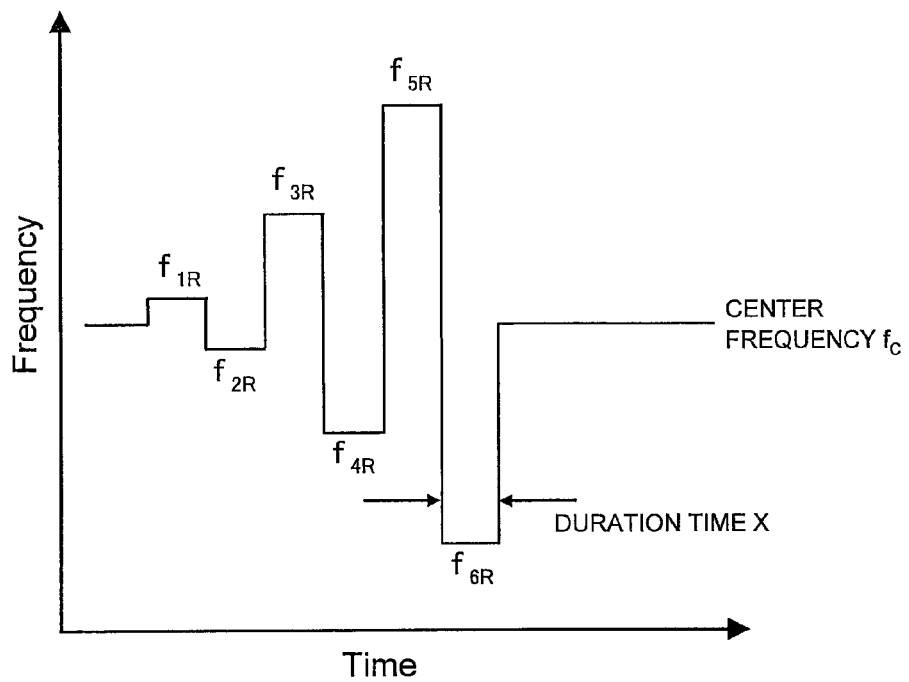
FIG. 8 shows an example of a test pattern signal.

FIG. 7 is a detailed flow chart of the digital gain setting process in FIG. 3. FIG. 8 shows an example of the test pattern signal. With reference to FIGS. 1 and 8, the following will describe the process of setting the digital gain coefficient of the variable digital gain adjuster 18 and a process of measuring the non-linearity of the VCO 25.

After the analog gain coefficient of the variable analog gain adjuster 20 is set at step S14, the frequency modulator 10 temporarily sets the digital gain coefficient of the variable digital gain adjuster 18 to an initial value (step S151). Specifically, the calculation section 21 generates first control information for specifying the digital gain coefficient $g_0$, and outputs the first control information to the variable digital gain adjuster 18 via the gain coefficient storage section 22.

After the digital gain coefficient is temporarily set, the frequency modulator 10 inputs the test pattern signal (see FIG. 8) (step S152). As shown in FIG. 8, the test pattern signal consists of a sequence of second test signals (digital signals), each of duration "x", representing a plurality (six in the present embodiment) of reference frequencies $f_{1R}, f_{2R}, \ldots f_{6R}$. Although described later, each second test signal is converted by the DAC 19 into an analog signal, and then inputted to the VCO 25. As each analog signal is inputted to the VCO 25, the output frequency of the VCO 25 is detected by the frequency detector 26 in order to calculate a digital gain coefficient corresponding to the reference frequency of each second test signal. The duration "x" is set so that sufficient time is available to detect an average output frequency for each reference frequency.

The following will describe the test pattern signal in greater detail. In the present embodiment, in the test pattern signal, the second test signals of $f_{1R}, f_{2R}, \ldots f_{6R}$ are arranged such that consecutive pairs of reference frequencies are symmetrical to each other about the center frequency $f_C$. The relation of the frequency of each second test signal is as follows. The difference between the reference frequency $f_{1R}$ and the center frequency $f_C$ is equal to the difference between the reference frequency $f_{2R}$ and the center frequency $f_C$. The difference between the reference frequency $f_{3R}$ and the center frequency $f_C$ is equal to the difference between the reference frequency $f_{4R}$ and the center frequency $f_C$. The difference between the reference frequency $f_{5R}$ and the center frequency $f_C$ is equal to the difference between the reference frequency $f_{6R}$ and the center frequency $f_C$.

By the above analog signals being inputted to the VCO 25, the first reference frequency in each pair pushes the output frequency of the VCO 25 above the center frequency $f_C$. The second reference frequency in each pair is applied to pull the output frequency of the VCO 25 below the center frequency $f_C$ by the same nominal amount. The symmetry of the reference frequency pairs about the center frequency $f_C$ allows drift-induced errors to be factored out in the digital gain coefficient calculation process. Each consecutive pair of reference frequencies also results in a greater frequency deviation from the center frequency $f_C$. By stepping the reference frequency deviations from a low frequency deviation to progressively higher frequency deviations, the potential for errors resulting from frequency drift of the VCO 25 is minimized.

The number of reference frequencies used in the test pattern signal and the range of frequencies represented by all reference frequencies in the test pattern signal are determined by the degree of gain correction precision desired or required, the modulation bandwidth of the modulation applied to the input of the VCO 25, and/or the time available or allotted to complete a calibration process during the final stage of the tuning process.

After such a test pattern signal is generated by the test signal generator 13, the first selection section 14 outputs, to the variable digital gain adjuster 18, the second test signal representing the first reference frequency $f_{1R}$. This second test signal is gain-adjusted by the variable digital gain adjuster 18 in accordance with the digital gain coefficient $g_0$ temporarily set at step S151. The gain-adjusted second test signal is converted by the DAC 19 into an analog signal, and inputted to the VCO 25. The VCO 25 performs frequency modulation based on the analog signal of the first reference frequency $f_{1R}$ inputted in such a manner. Thus, the resultant modulation signal is outputted from the VCO 25.

The frequency detector 26 detects the output frequency of the modulation signal outputted from the VCO 25 (step S153). Specifically, the frequency detector 26 digitalizes the modulation signal, and decimates the result of the digitalization for supplying a digital signal representing the measured average output frequency. The signal representing the output frequency detected by the frequency detector 26 is outputted to the calculation section 21.

The calculation section 21 calculates, based on the following formula (1), a digital gain coefficient used for gain-adjusting the input signal and dealing with the non-linear response of the VCO 25 (step S154).

$$G1 = G[(f_{1R} - f_C)/(f_{1M} - f_C)] \qquad \text{formula (1)}$$

In the formula (1), G denotes the digital gain coefficient $g_0$ temporarily set at step S151, $f_{1R}$ denotes a first reference frequency, G1 denotes a digital gain coefficient with respect to the first reference frequency $f_{1R}$, $f_C$ denotes the center frequency of the test pattern signal, and $f_{1M}$ denotes the output frequency width of the output frequency detected by the frequency detector 26 with respect to the first reference frequency $f_{1R}$. The calculation section 21 stores the digital gain coefficient G1, which is calculated at step S154, in the gain coefficient storage section 22 (step S155). In other words, the calculation section 21 generates first control information for specifying the analog gain coefficient G1, and outputs the generated first control information to the gain coefficient storage section 22.

At step S156, whether or not there are any reference frequencies for which a digital gain coefficient has not been calculated is determined. When digital gain coefficients have not been calculated for all the reference frequencies (the first reference frequency $f_{1R}$ to the sixth reference frequency $f_{6R}$ in the present embodiment) (step S156: YES), the processes at steps S152 to S155 are performed for the reference frequencies for which a digital gain coefficient has not been calculated. When digital gain coefficients have been calculated for all the reference frequencies (step S156: NO), the series of processes are terminated. In the present embodiment, the process of calculating the digital gain coefficient G1 for the second test signal of the first reference frequency $f_{1R}$ in the test pattern signal has been described, and the same process as this process is performed for calculating digital gain coefficients for the second test signals of the other reference frequencies. Thus, the process of calculating digital gain coefficients G2 to G6 for the second test signals of the second reference frequency $f_{2R}$ to the sixth reference frequency $f_{6R}$ will not be described.

In the present embodiment, the test pattern signal consists of the second test signals representing the six different reference frequencies $f_{1R}, f_{2R}, \ldots f_{6R}$. Thus, execution of the non-linearity measurement process (the processes at steps S152 to S156) at step S15 allows six different digital gain coefficients to be calculated. Such a test pattern signal is suitable for calibrating the gain of the VCO 25 over a modulation bandwidth used in wideband code division multiple access (W-CDMA) cellular communications applications. The number of digital signals (second test signals) constituting the test pattern signal is not limited to 6. The number of digital signals may be changed as appropriate depending on the degree of correction precision required and the modulation bandwidth of the baseband modulation signal applied to the VCO 25 as the input signal.

The following will describe the case where the non-linearity of the VCO 25 is not compensated. In the case where the non-linearity of the VCO 25 is not compensated, for example, a digital gain coefficient g may be calculated using a second test signal similar to the first test signal shown in FIG. 5(A). The following formula (2) is used for calculating the digital gain coefficient g.

$$g = \frac{f_0}{f_1} g_0 \qquad \text{formula (2)}$$

In the formula (2), g denotes a digital gain coefficient set for the variable digital gain adjuster 18, $g_0$ denotes the digital gain coefficient $g_0$ temporarily set at step S151, $f_0$ denotes the frequency width of the second test signal, and $f_1$ denotes the output frequency width of the output frequency detected by the frequency detector 26. As described above, the calculation section 21 generates first control information based on the frequency width $f_0$ of the second test signal, the output frequency width $f_1$ of the VCO 25, and the predetermined value $g_0$, and outputs the first control information to the gain coefficient storage section 22. This first control information is read from the gain coefficient storage section 22 by the variable digital gain adjuster 18. Thus, the digital gain coefficient is set for the variable digital gain adjuster 18.

When it is determined as NO at step S156, the first selection section 14 is connected to a terminal a, and the second selection section 29 is connected to a terminal a. In this state, the baseband modulation signal is inputted as the input signal from the input terminal 11, and the aforementioned normal process is started.

As is obvious from the description so far, the analog gain coefficient of the variable analog gain adjuster 20 is set, and then the digital gain coefficient of the variable digital gain adjuster 18 is set. In other words, the process of generating the second control information is performed prior to the process of generating the first control information. Thus, for example, even when the analog gain coefficient becomes different from a set value due to individual variation and/or a change in the characteristic of the variable analog gain adjuster 20 that is caused by a temperature change, this can be compensated by gain adjustment in accordance with the digital gain coefficient.

As described above, the input signal to be inputted as the first signal to the VCO 25 is gain-adjusted by two gain adjusters, namely, the variable digital gain adjuster 18 and the variable analog gain adjuster 20, based on the analog gain coefficient and the digital gain coefficient that are set in advance by the calculation section 21. In the present embodiment, the second control information is generated prior to the generation of the first control information, and hence the gain variation of the VCO 25 is suppressed mainly by the variable analog gain adjuster 20. This eliminates a need to reduce the digital gain coefficient of the variable digital gain adjuster 18 in order to suppress the gain variation of the VCO 25, and hence a sufficient effective number of bits of the digital gain of the variable digital gain adjuster 18 can be ensured. Therefore, the input signal can be frequency-modulated without increasing quantization noise.

The present embodiment has described the case where the output of the second selection section 29 and the output of the gain adjustment section 42 are individually inputted to the VCO 25. However, the output of the second selection section 29 and the output of the gain adjustment section 42 may be combined, and then inputted to the VCO 25. In this case, the combined output should be supplied to the connection point Y between the variable capacitance elements 73 and 74 (see FIG. 2), and thus the variable capacitance elements 75 and 76 of the VCO 25 are unnecessary.

Further, the configuration of the gain adjustment section 42 is not limited to the configuration shown in FIG. 1. For example, the variable analog gain adjuster 20 may have the function of the DAC 19 and a function of gain-adjusting an analog signal. In this case, the DAC 19 is unnecessary. Alternatively, the gain adjustment section 42 may be configured such that a signal gain-adjusted by the variable analog gain adjuster 20 is gain-adjusted by the variable digital gain adjuster 18.

Second Embodiment

Figure 9:
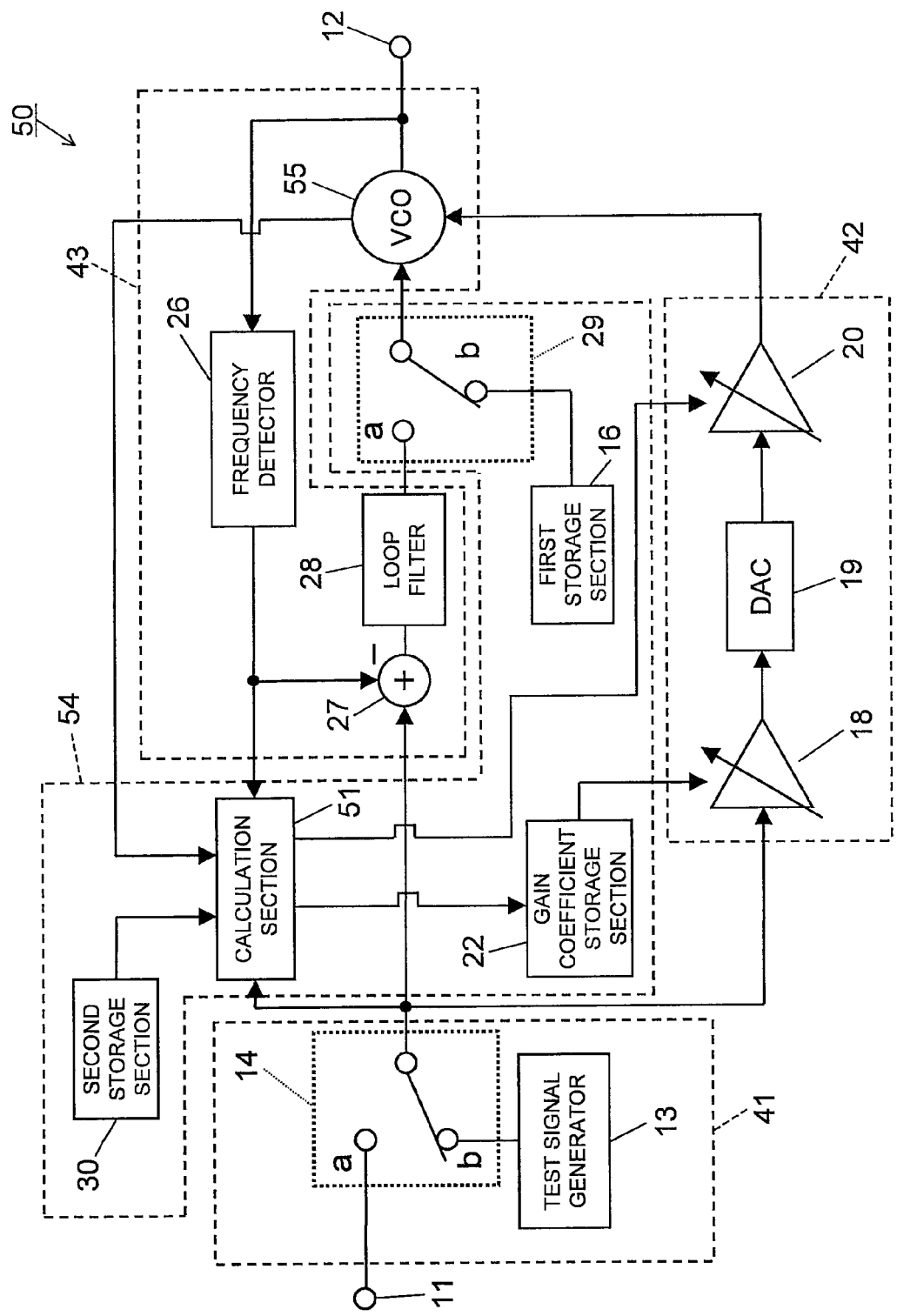
FIG. 9 shows an exemplary configuration of a frequency modulator 50 according to a second embodiment of the present invention.

The following will describe a second embodiment of the present invention. FIG. 9 shows an exemplary configuration of a frequency modulator 50 according to the second embodiment of the present invention. The configuration of the frequency modulator 50 is the same as that of the frequency modulator 10 of the first embodiment, except that a VCO 55 is capable of switching a band and a generation section 54 further includes a second storage section 30. Thus, hereinafter, the frequency modulator 50 according to the second embodiment will be described with a focus on these different points. First, the difference in configuration between the frequency modulator 50 and the frequency modulator 10 will be described.

Figure 10:
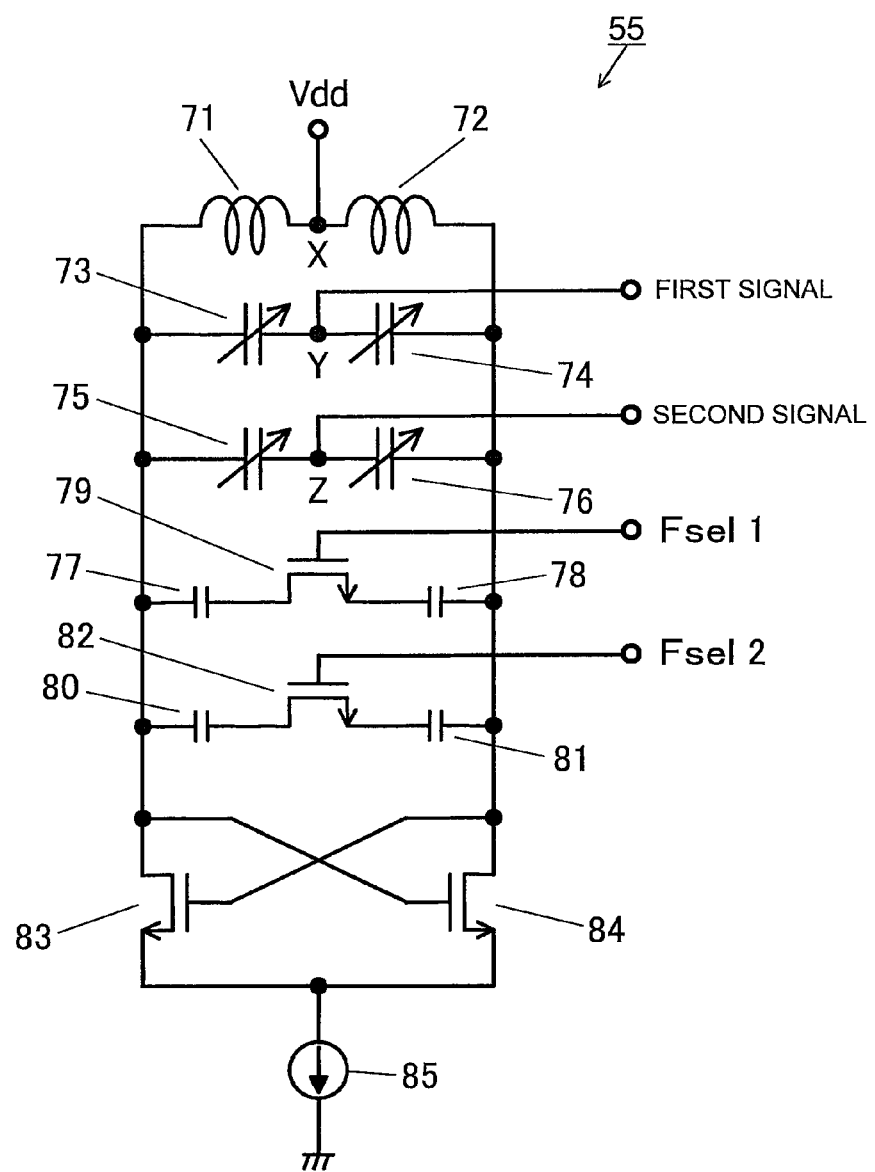
FIG. 10 shows an exemplary configuration of a VCO 55.

FIG. 10 shows an exemplary configuration of the VCO 55. In addition to the components of the VCO 25 shown in FIG. 2, the VCO 55 further includes capacitance elements 77 and 78, a switching element 79, capacitance elements 80 and 81, and a switching element 82. A control signal Fsel1 and a control signal Fsel2 are inputted from a switching circuit (not shown) to the switching element 79 and the switching element 82, respectively.

Figure 11:
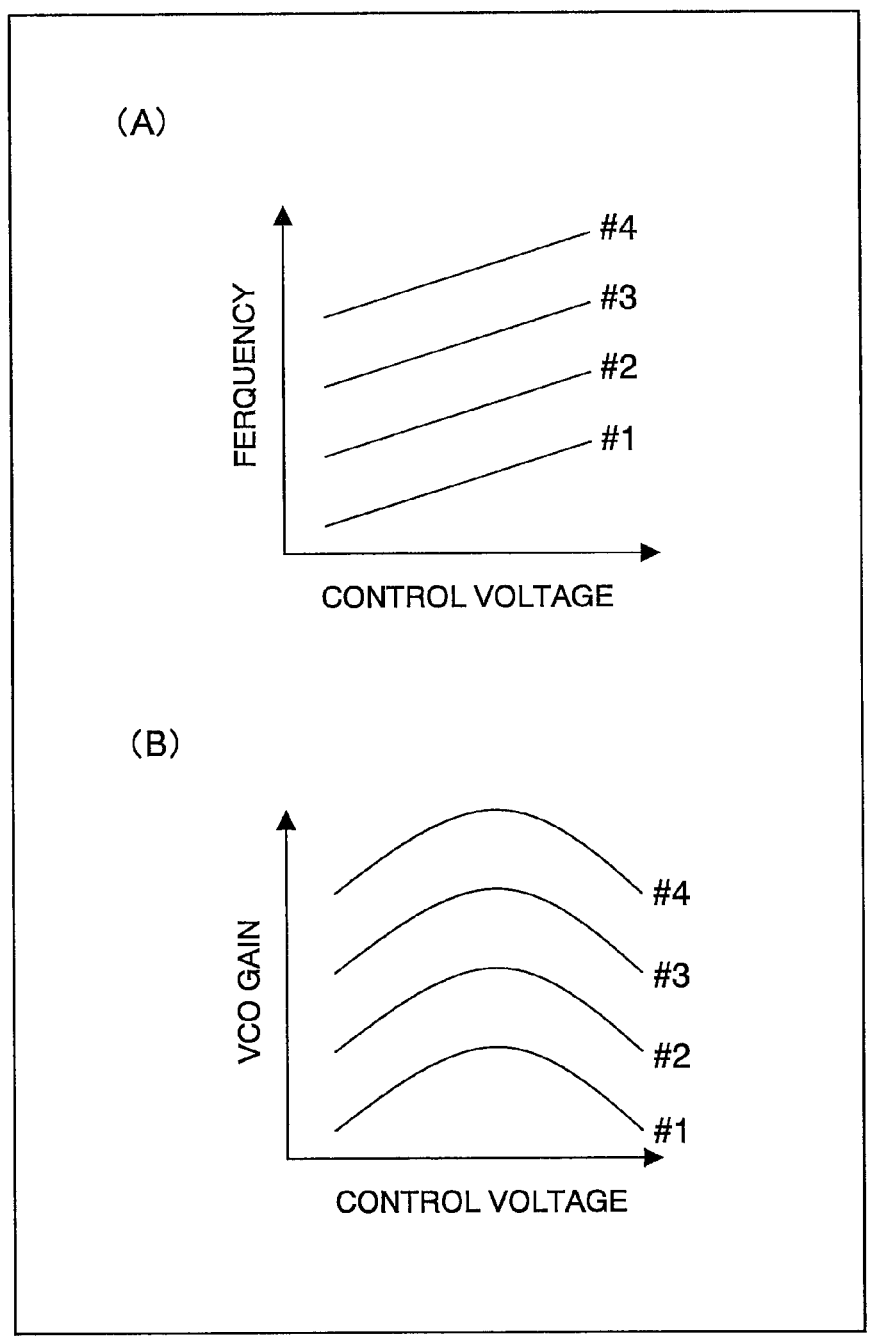
FIG. 11 shows characteristics of the VCO 55.

In the VCO 55, the total capacitance value of the VCO 55 is changed by controlling a first signal, a second signal, the control signal Fsel1, and the control signal Fsel2. As a result, the oscillatory frequency of a frequency-modulated signal outputted from the VCO 55 changes. FIG. 11 shows characteristics of the VCO 55, (A) shows changes in an oscillatory frequency with respect to a control voltage (the first signal and the second signal), and (B) shows changes in the gain of the VCO 25 with respect to a control voltage. In FIG. 11, #1 indicates the frequency characteristic when the control signal Fsel1 and the control signal Fsel2 are at HIGH, #2 indicates the frequency characteristic when the control signal Fsel1 is at LOW and the control signal Fsel2 is at HIGH, #3 indicates the frequency characteristic when the control signal Fsel1 is at HIGH and the control signal Fsel2 is at LOW, and #4 indicates the frequency characteristic when the control signal Fsel1 and the control signal Fsel2 are at LOW.

As described above, the VCO 25 is capable of switching the oscillation band of the oscillatory frequency of the frequency-modulated signal among #1 to #4 by switching the control signals Fsel1 and Fsel2. Thus, a wide variable range of the oscillatory frequency is ensured. The number of selectable oscillation bands is not limited to 4, and may be changed as appropriate.

Figure 12:
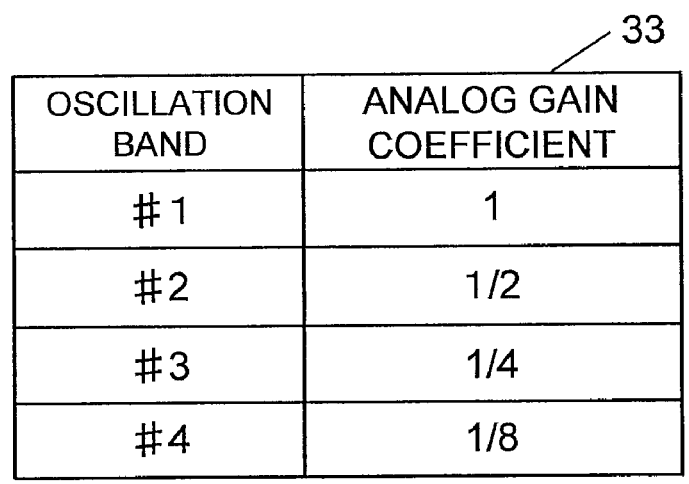
FIG. 12 shows an example of a look-up table 33.

As shown in FIG. 9, the generation section 54 further includes the second storage section 30, in addition to the components of the generation section 44 (see FIG. 1). The second storage section 30 is a memory for storing analog gain information. In the present embodiment, the analog gain information is stored as a look-up table 33 in the second storage section 30. FIG. 12 shows an example of the look-up table 33. In the look-up table 33, the oscillation bands selectable by the VCO 55 are associated with analog gain coefficients capable of being set for a variable analog gain adjuster 20. Here, the association between the oscillation bands #1 to #4 and the analog gain coefficients in the look-up table 33 will be described.

For example, when #1 is selected as the oscillation band of the VCO 55, the gain of the VCO 55 is smaller as compared with that when the other oscillation bands #2 to #4 are selected (see FIG. 11(B)). In this case, the gain of the VCO 55 does not need to be reduced. Thus, when #1 is selected as the oscillation band, the analog gain coefficient of the variable analog gain adjuster 20 is set to "1".

Further, when #2 is selected as the oscillation band of the VCO 55, the gain of the VCO 55 is greater as compared with that when the oscillation band #1 is selected (see FIG. 11(B)). In this case, in order to reduce the gain of the VCO 55, the analog gain coefficient of the variable analog gain adjuster 20 needs to be reduced as compared with that when #1 is selected as the oscillation band. Thus, when #2 is selected as the oscillation band, the analog gain coefficient of the variable analog gain adjuster 20 is set to "½".

Further, when #3 is selected as the oscillation band of the VCO 55, the gain of the VCO 55 is greater as compared with that when the oscillation band #2 is selected (see FIG. 11(B)). In this case, in order to reduce the gain of the VCO 55, the analog gain coefficient of the variable analog gain adjuster 20 needs to be reduced as compared with that when #2 is selected as the oscillation band. Thus, when #3 is selected as the oscillation band, the analog gain coefficient of the variable analog gain adjuster 20 is set to "¼".

Further, when #4 is selected as the oscillation band of the VCO 55, the gain of the VCO 55 is the maximum (see FIG. 11(B)). In this case, in order to reduce the gain of the VCO 55, the analog gain coefficient of the variable analog gain adjuster 20 needs to be reduced as compared with that when #3 is selected as the oscillation band. Thus, when #4 is selected as the oscillation band, the analog gain coefficient of the variable analog gain adjuster 20 is set to "⅛".

As described above, the oscillation bands selectable by the VCO 55 and the analog gain coefficients for the variable analog gain adjuster 20, which are suitable for the oscillation bands, respectively, are stored in the second storage section 30 so as to be associated with each other.

The following will describe a process, among processes performed by the frequency modulator 50, which is different from the process performed by the frequency modulator 10 according to the first embodiment. The processes performed by the frequency modulator 50 differ from the processes performed by the frequency modulator 10 mainly in an analog gain setting process (step S14). In the analog gain setting process, second control information is generated based on information of an oscillation band currently selected by the VCO 55 as information regarding a state of the VCO 55.

Figure 13:
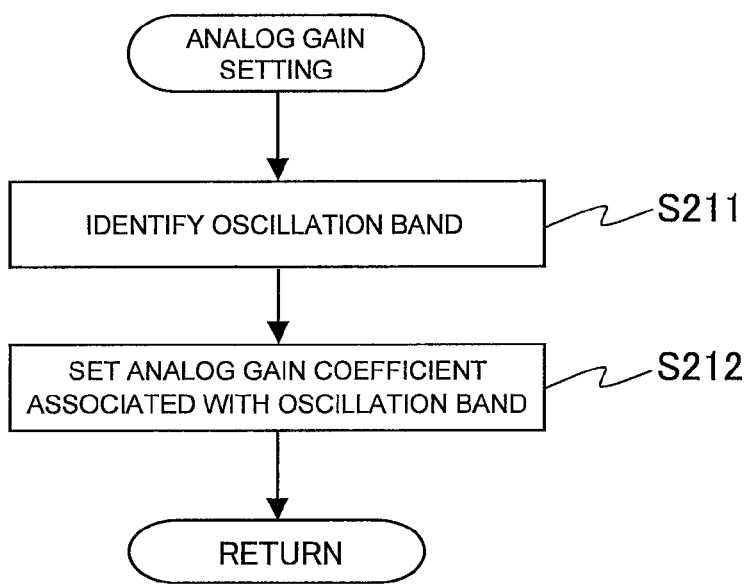
FIG. 13 is a detailed flow chart of an analog gain setting process in the second embodiment.

FIG. 13 is a detailed flow chart of the analog gain setting process in the second embodiment. After the loop of a frequency modulation section 43 is opened in a process at step S13, a calculation section 21 identifies the oscillation band currently selected by the VCO 55 as shown in FIG. 13 (step S211). Specifically, the calculation section 21 obtains, from the VCO 55, information regarding the control signal Fsel1 and the control signal Fsel2, and identifies whether the oscillation band currently selected by the VCO 55 is #1, #2, #3, or #4.

The calculation section 21 sets an analog gain coefficient associated with the identified oscillation band (step S212). Specifically, the calculation section 21 reads, from the look-up table 33, the analog gain coefficient associated with the identified oscillation band. Then, the calculation section 21 generates second control information for specifying the read analog gain coefficient, and outputs the second control information to the variable analog gain adjuster 20. For example, when the identified oscillation band is #1, the calculation section 21 reads, from the look-up table 33, an analog gain coefficient of "1" associated with the oscillation band #1, generates second control information for specifying the analog gain coefficient of "1", and outputs the second control information to the variable analog gain adjuster 20. Thus, the analog gain coefficient of the variable analog gain adjuster 20 is set to the analog gain coefficient specified by the second control information.

According to the frequency modulator 50 of the second embodiment described above, the second control information is generated based on the information of the oscillation band of the VCO 55, and hence a process of detecting the output frequency of the VCO 55 and calculation using an arithmetic expression are unnecessary. Therefore, the second control information can be generated easily and rapidly. As a result, the time period from the start of the adjustment process until the start of the normal process can be shortened.

Third Embodiment

Figure 14:
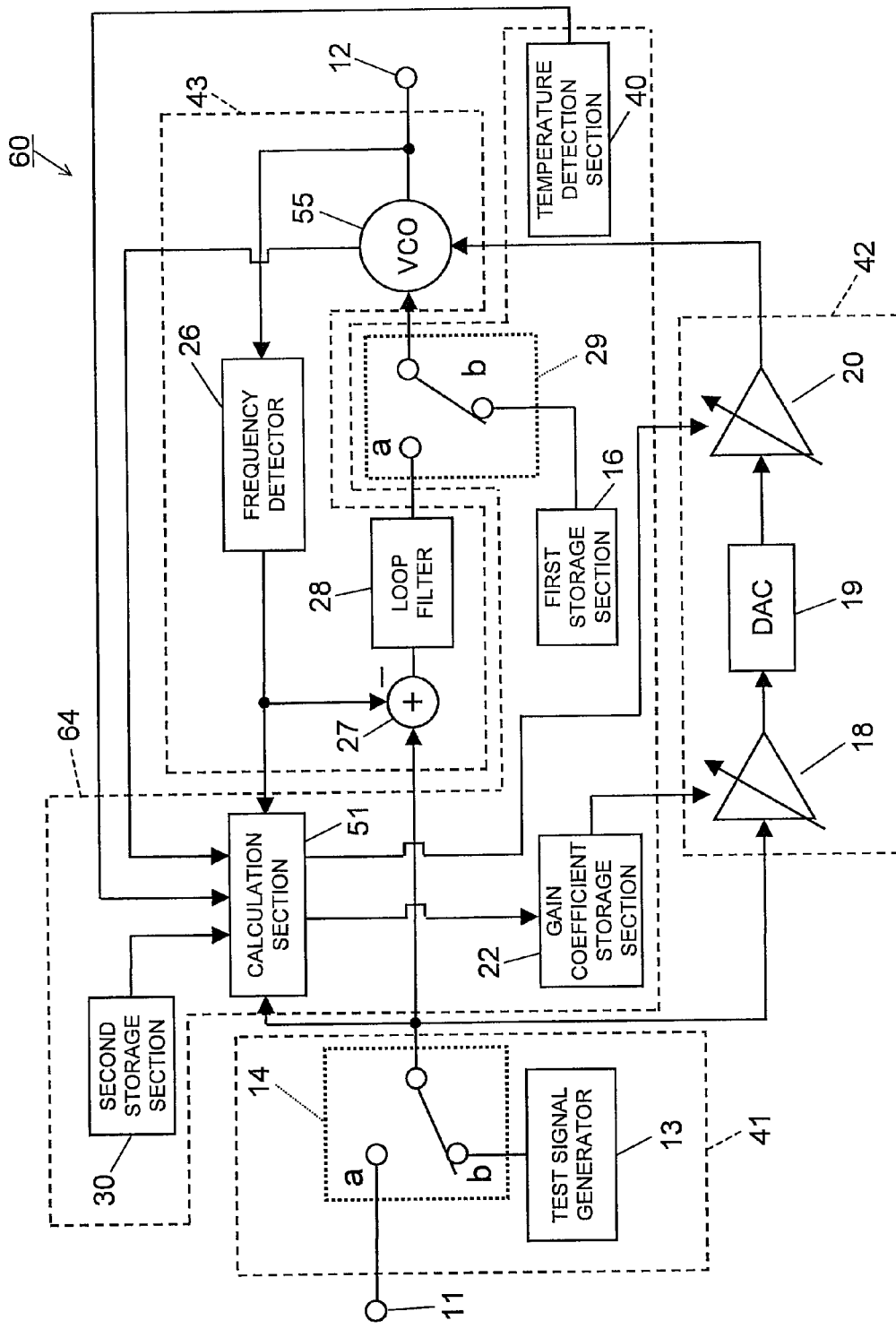
FIG. 14 shows an exemplary configuration of a frequency modulator 60 according to a third embodiment of the present invention.

The following will describe a third embodiment of the present invention. FIG. 14 shows an exemplary configuration of a frequency modulator 60 according to the third embodiment of the present invention. The configuration of the frequency modulator 60 is the same as that of the frequency modulator 50 according to the second embodiment, except that a generation section 64 further includes a temperature detection section 40 and a second storage section 30 stores analog gain information per temperature. Thus, hereinafter, the frequency modulator 60 according to the third embodiment will be described with a focus on these different points. First, the difference in configuration between the frequency modulator 60 and the frequency modulator 50 will be described.

The generation section 64 further includes the temperature detection section 40, in addition to the components of the generation section 54 (see FIG. 9). The temperature detection section 40 is provided adjacently to a VCO 55. The temperature detection section 40 detects the temperature of the VCO 55. As the temperature detection section 40, an NTC thermistor or the like is used. However, the temperature detection section 40 may be other temperature detection means.

Figure 15:
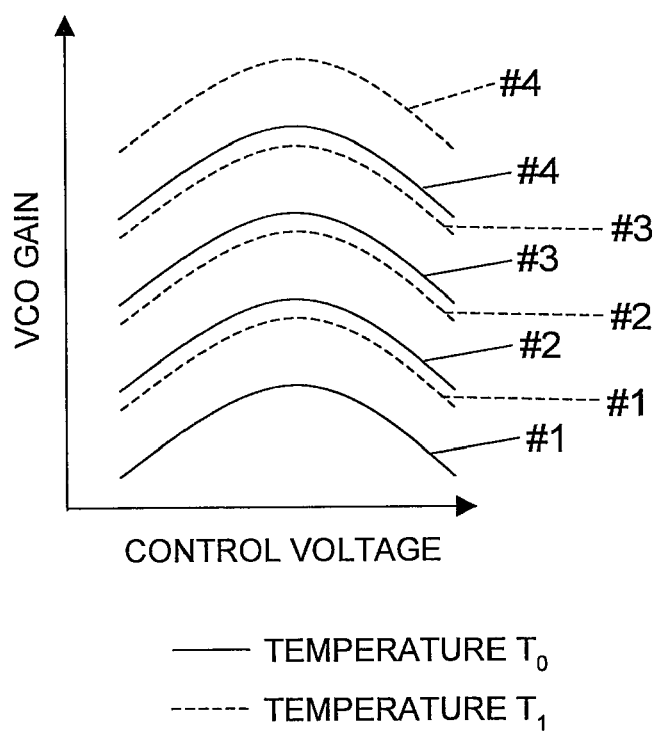
FIG. 15 shows changes in the gain of a VCO 55 with respect to a control voltage.

FIG. 15 shows changes in the gain of the VCO 55 with respect to a control voltage, gain characteristics corresponding to oscillation bands #1 to #4 in the case where the temperature is $T_0$ are indicated by solid lines, and gain characteristics corresponding to the oscillation bands #1 to #4 in the case where the temperature is $T_1$ are indicated by dashed lines.

When the temperature changes, for example, the inductances of the inductors 71 and 72 (see FIG. 10) of the VCO 55 are thought to change. The oscillatory frequency of the VCO 55 depends on the inductances of the inductors 71 and 72, the capacitance values of the variable capacitance elements 73 to 76, and the capacitance values of the capacitance elements 77, 78, 80, and 81. Thus, when a temperature change occurs, the oscillatory frequency of the VCO 55 changes, resulting in that the gain of the VCO 55 changes. This is obvious from FIG. 15. As described above, when the gain of the VCO 55 changes due to a temperature change, the case may occur where the analog gain coefficient of a variable analog gain adjuster 20 cannot be set to an appropriate value depending on the temperature.

Here, in the third embodiment, analog gain information per temperature is stored in the second storage section 30 in order to set an appropriate analog gain coefficient for the variable analog gain adjuster 20 even when the temperature changes. In the present embodiment, for convenience of explanation, the case where analog gain information for two temperatures is stored as look-up tables 34 and 35 (see FIG. 16) in the second storage section 30 will be described.

FIG. 16 shows the look-up tables 34 and 35, (A) shows the look-up table 34 for a temperature of $T_0$, and (B) shows the look-up table 35 for a temperature of $T_1$. Here, the association among the oscillation bands #1 to #4, the analog gain coefficients, and the temperatures in the look-up tables 34 and 35 will be described.

When #1 is selected as the oscillation band of the VCO 55, the analog gain coefficient is set to "1" in the case where the temperature is $T_0$. On the other hand, when the temperature rises from $T_0$ to $T_1$, the gain of the VCO 55 increases accordingly (see FIG. 15). Thus, when #1 is selected as the oscillation band of the VCO 55, the analog gain coefficient is set to "½" in the case where the temperature is $T_1$.

As described above, because the analog gain information (the look-up tables 34 and 35) per temperature is stored in the second storage section 30, an appropriate analog gain coefficient can be set for the variable analog gain adjuster 20 even when the gain of the VCO 55 changes with a temperature change.

The following will describe a process, among processes performed by the frequency modulator 60, which is different from the process performed by the frequency modulator 50 according to the second embodiment. The processes performed by the frequency modulator 60 differ from the processes performed by the frequency modulator 50 only in an analog gain setting process (step S14). In the analog gain setting process, as information regarding a state of the VCO 55, second control information is generated based on information of an oscillation band currently selected by the VCO 55 and the temperature of the VCO 55 that is detected by the temperature detection section 40.

Figure 17:
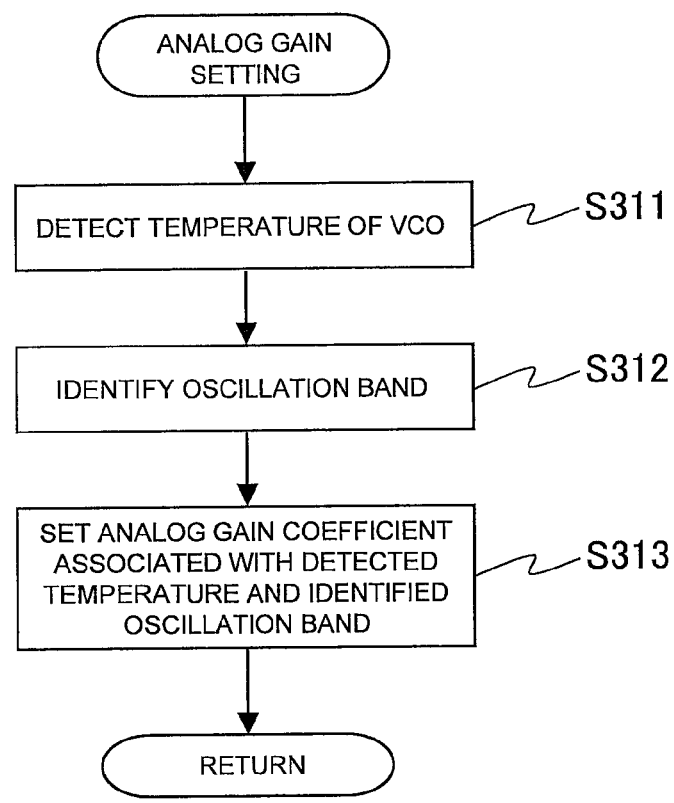
FIG. 17 is a detailed flow chart of an analog gain setting process in the third embodiment.

FIG. 17 is a detailed flow chart of the analog gain setting process in the third embodiment. As shown in FIG. 17, the temperature detection section 40 detects the temperature of the VCO 55 (step S311). Information of the detected temperature is outputted from the temperature detection section 40 to the calculation section 21. Next, similarly as in the process at step S211, the calculation section 21 identifies the oscillation band currently selected by the VCO 55 (step S312).

The calculation section 21 sets an analog gain coefficient associated with the detected temperature and the identified oscillation band (step S313). Specifically, the calculation section 21 reads, from the look-up table 34 or the look-up table 35, the analog gain coefficient that is associated with the temperature detected by the temperature detection section 40 and associated with the oscillation band currently selected by the VCO 55. Then, the calculation section 21 generates second control information for specifying the read analog gain coefficient, and outputs the second control information to the variable analog gain adjuster 20.

For example, when the detected temperature is $T_0$ and the oscillation band currently selected by the VCO 55 is #1, the calculation section 21 reads, from the look-up table 34, an analog gain coefficient of "1" associated with the oscillation band #1. Then, the calculation section 21 generates second control information for specifying the analog gain coefficient of "1", and outputs the second control information to the variable analog gain adjuster 20. Further, for example, when the detected temperature is $T_1$ and the oscillation band currently selected by the VCO 55 is #3, the calculation section 21 reads, from the look-up table 35, an analog gain coefficient of "⅛" associated with the oscillation band #3. Then, the calculation section 21 generates second control information for specifying the analog gain coefficient of "⅛", and outputs the second control information to the variable analog gain adjuster 20.

As described above, according to the frequency modulator 60 of the third embodiment, because the analog gain information per temperature is stored in the second storage section 30, the analog gain coefficient of the variable analog gain adjuster 20 can be set to an appropriate value even when the characteristic of the VCO 55 changes due to a temperature change.

The number of analog gain information stored in the second storage section 30 is not limited to 2 as described in the present embodiment. The number of analog gain information may be changed as appropriate depending on a degree of temperature change of the VCO 55. When there is the possibility that the temperature of the VCO 55 will change considerably, analog gain information for three or more temperatures, for example, analog gain information for a temperature of $T_0$, analog gain information for a temperature of $T_1$, analog gain information for a temperature of $T_2$, and analog gain information for a temperature of $T_3$, may be stored in the second storage section 30.

Fourth Embodiment

The following will describe a fourth embodiment of the present invention. A frequency modulator according to the fourth embodiment is the same in configuration as, but different from the frequency modulator 10 according to the first embodiment in a process performed during the adjustment process. Thus, here, only the process different from that in the first embodiment will be described, and the other processes will not be described.

The first to third embodiments have described the case where a digital gain coefficient is obtained after an analog gain coefficient is obtained. On the other hand, in the fourth embodiment, a digital gain coefficient and an analog gain coefficient for controlling the gain of a VCO 25 are obtained together based on the output frequency of the VCO 25 that is detected by a frequency detector 26. Then, a plurality of digital gain coefficients used for dealing with a non-linear response of the VCO 25 is obtained. The following will describe this series of processes in detail.

Figure 18:
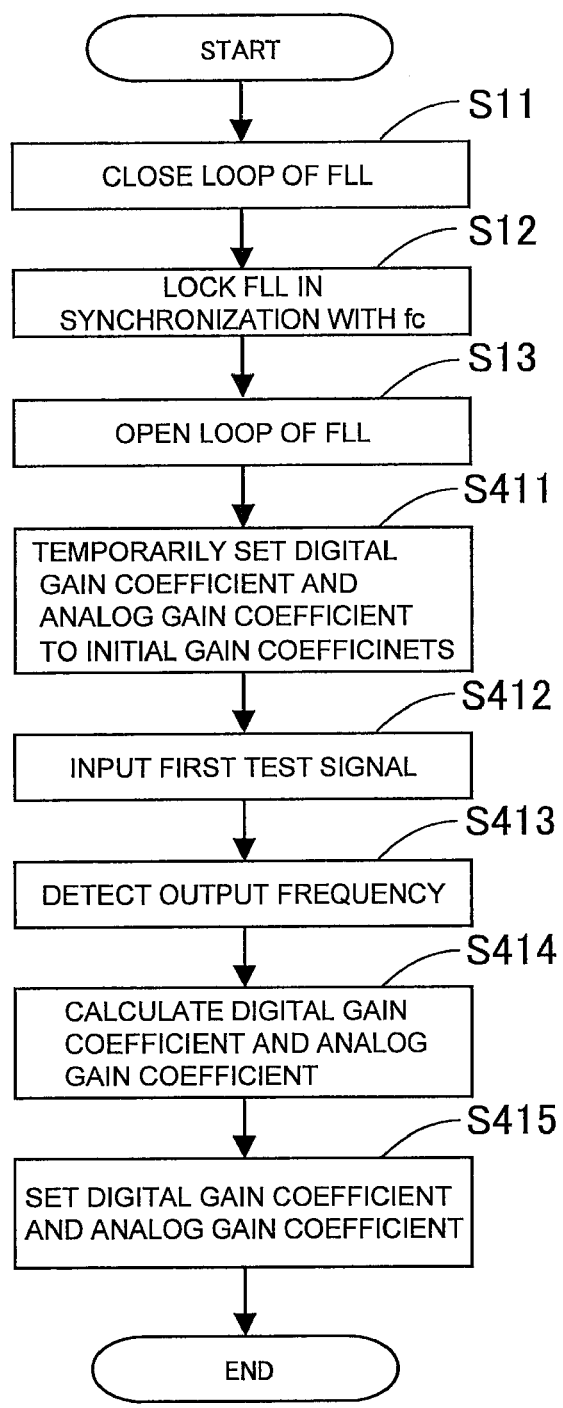
FIG. 18 is a flow chart showing an example of a process performed by a frequency modulator 10 in a fourth embodiment.
Figure 19:
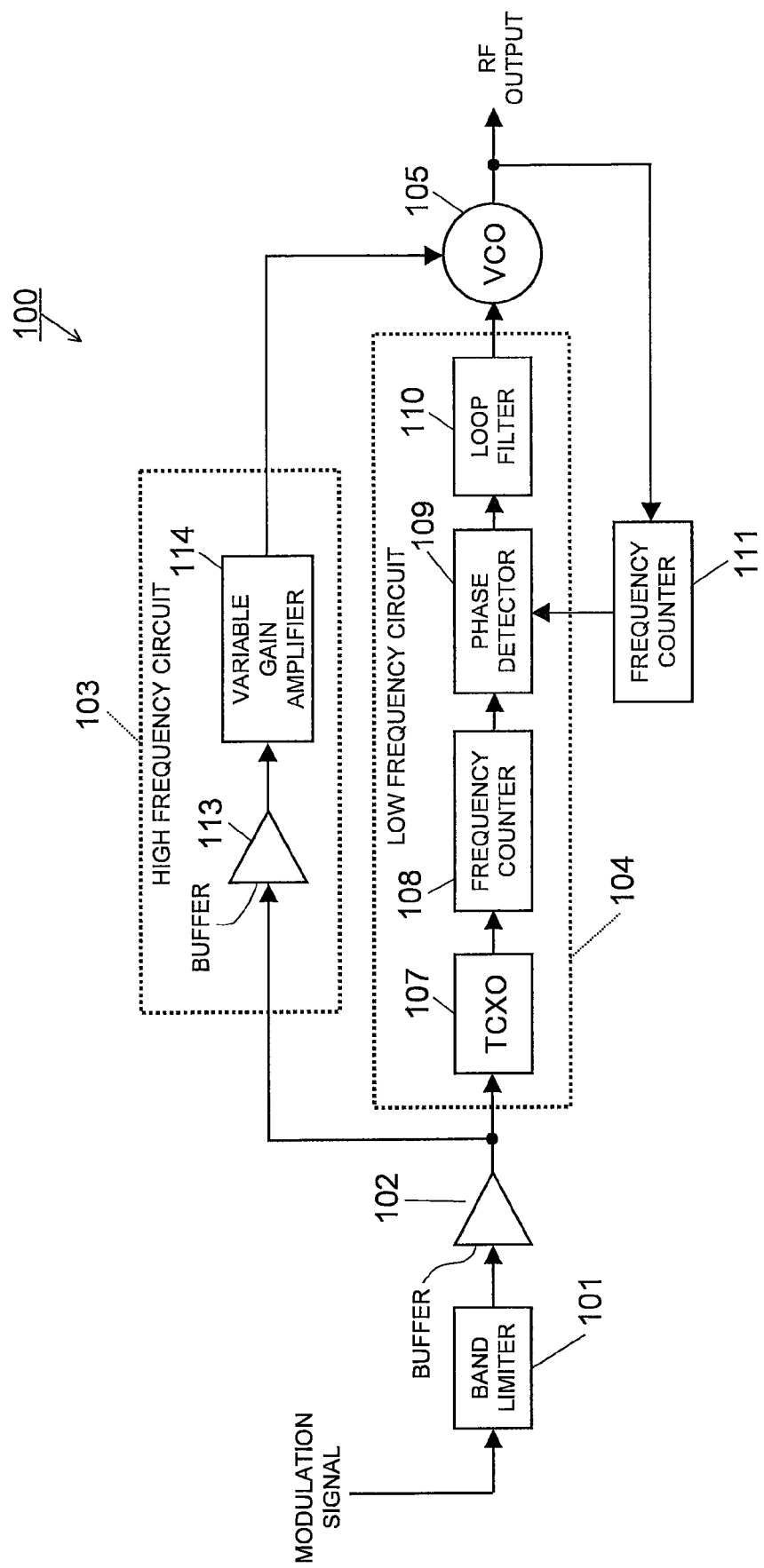
FIG. 19 shows a configuration of a conventional frequency modulator 100.

FIG. 18 is a flow chart showing an example of a process performed by the frequency modulator 10 in the fourth embodiment. The same processes as those in the first embodiment are designated by the same step numbers, and the description thereof will not be provided. After the loop of a frequency modulation section 43 is opened in a process at step S13, a calculation section 21 temporarily sets the digital gain coefficient of a variable digital gain adjuster 18 and the analog gain coefficient of a variable analog gain adjuster 20 to a first initial gain coefficient $g_{fi}$ and a second initial gain coefficient $g_{ci}$, respectively (step S411). Specifically, the calculation section 21 generates first control information for specifying the first initial gain coefficient $g_{fi}$ and second control information for specifying the second initial gain coefficient $g_{ci}$. Then, the calculation section 21 outputs the first control information and the second control information to the variable digital gain adjuster 18 and the variable analog gain adjuster 20, respectively. Thus, the digital gain coefficient of the variable digital gain adjuster 18 is temporarily set to the first initial gain coefficient $g_{fi}$ (e.g. 11 bits), and the analog gain coefficient of the variable analog gain adjuster 20 is temporarily set to the second initial gain coefficient $g_{ci}$ (e.g. "½").

Next, in the frequency modulator 10, similarly as in the process at step S142, a first test signal is inputted to the VCO 25 together with a signal indicative of a constant (step S412). Thus, the first test signal is gain-adjusted in accordance with the first initial gain coefficient $g_{fi}$, and then converted by a DAC 19 into an analog signal. This analog signal is gain-adjusted in accordance with the second initial gain coefficient $g_{ci}$ and inputted as a first signal to the VCO 25. On the other hand, similarly as in the process at step S143, the frequency detector 26 detects the output frequency of a modulation signal outputted from the VCO 25 (step S413).

After the output frequency of the VCO 25 is detected, the calculation section 21 calculates a digital gain coefficient and an analog gain coefficient based on an arithmetic expression represented by the following formula (3) (step S414). The digital gain coefficient and the analog gain coefficient that are calculated here are gain coefficients for controlling the gain of the VCO 25.

$$g_f g_c = \frac{f_0}{f_i} g_{fi} g_{ci} \quad \text{formula (3)}$$

In the formula (3), $g_f$ denotes a digital gain coefficient to be obtained, $g_c$ denotes an analog gain coefficient to be obtained, $f_i$ denotes the output frequency width of the output frequency detected by the frequency detector 26, $f_0$ denotes the frequency width of the first test signal generated by a test signal generator 13, $g_{fi}$ denotes the temporarily set first initial gain coefficient, and $g_{ci}$ denotes the temporarily set second initial gain coefficient.

The calculation section 21 substitutes the first initial gain coefficient $g_{fi}$ and the second initial gain coefficient $g_{ci}$ that are temporarily set at step S411, the frequency width $f_0$ of the first test signal inputted from the first selection section 14, and the output frequency width $f_1$ of the output frequency detected by the frequency detector 26, into the arithmetic expression represented by the formula (3). Thus, the digital gain coefficient $g_f$ and the analog gain coefficient $g_c$ are obtained together.

In the arithmetic expression represented by the formula (3), the left side is represented by the multiplication of the digital gain coefficient $g_f$ and the analog gain coefficient $g_c$, and hence there are a plurality of combinations of digital gain coefficients $g_f$ and analog gain coefficients $g_c$. In the present embodiment, under the condition that the digital gain coefficient $g_f$ is equal to or less than a threshold value, a combination with the minimum analog gain coefficient $g_c$ is selected to obtain the digital gain coefficient $g_f$ and the analog gain coefficient $g_c$. For example, when the analog gain coefficient $g_c$ can be "½" or "¼", the calculation section 21 obtains the digital gain coefficient $g_f$ and the analog gain coefficient $g_c$ such that the analog gain coefficient $g_c$ is "¼".

After the digital gain coefficient $g_f$ and the analog gain coefficient $g_c$ are obtained, the calculation section 21 sets the obtained digital gain coefficient $g_f$ and the obtained analog gain coefficient $g_c$ (step S415). Specifically, the calculation section 21 generates first control information for specifying the digital gain coefficient $g_f$ and outputs the first control information to the gain coefficient storage section 22, and generates second control information for specifying the analog gain coefficient $g_c$ and outputs the second control information to the variable analog gain adjuster 20.

As described above, according to the frequency modulator 10 of the fourth embodiment, the digital gain coefficient $g_f$ and the analog gain coefficient $g_c$ are obtained together by the arithmetic expression represented by the formula (3), and thus the first control information and the second control information can be generated easily and rapidly. Further, because the first control information and the second control information are generated such that the analog gain coefficient gc is the minimum value among the possible values, it is possible to effectively prevent a reduction in the gain of the variable digital gain adjuster 18 with a reduction in the gain of the VCO 25.

While the invention has been described in detail, the foregoing description is in all aspects illustrative and not restrictive. It is understood that numerous other modifications and variations can be devised without departing from the scope of the invention.

What is claimed is:

1. A frequency modulator for frequency-modulating an input signal and outputting a frequency-modulated signal, the frequency modulator comprising:
   a signal selection section for selectively outputting the input signal or a test signal;
   a frequency modulation section for frequency-modulating the input signal and outputting the frequency-modulated signal;
   a generation section for generating, based on information regarding a state of the frequency modulation section and the test signal, first control information for specifying a digital gain coefficient and second control information for specifying an analog gain coefficient; and
   a gain adjustment section for controlling the gain of the frequency modulation section in accordance with the digital gain coefficient specified by the first control information and the analog gain coefficient specified by the second control information.

2. The frequency modulator according to claim 1, wherein: the signal selection section includes:
   a test signal generation section for generating the test signal; and
   a first selection section for selectively outputting the input signal or the test signal generated by the test signal generation section.

3. The frequency modulator according to claim 1, wherein: the signal selection section outputs the input signal to both the frequency modulation section and the gain adjustment section; and
   the gain adjustment section includes:
   a variable digital gain adjuster for gain-adjusting the input signal in accordance with the digital gain coefficient specified by the first control information;
   a digital/analog converter for converting, into an analog signal, the input signal gain-adjusted by the variable digital gain adjuster; and
   a variable analog gain adjuster for gain-adjusting, in accordance with the analog gain coefficient specified by the second control information, the analog signal converted by the digital/analog converter, and outputting the analog signal to the frequency modulation section.

4. The frequency modulator according to claim 1, wherein:
the signal selection section outputs the input signal to both the frequency modulation section and the gain adjustment section;
the gain adjustment section gain-adjusts the input signal in accordance with the digital gain coefficient specified by the first control information and the analog gain coefficient specified by the second control information, and outputs the input signal as a first signal to the frequency modulation section; and
the frequency modulation section includes:
    a voltage controlled oscillator for controlling an oscillatory frequency thereof in accordance with the first signal and a second signal to frequency-modulate the input signal and output the frequency-modulated signal;
    a frequency detector for detecting the output frequency of the frequency-modulated signal;
    a subtractor for generating an error signal representing the difference between the frequency of the input signal and the output frequency; and
    a loop filter for suppressing a high-frequency component of the error signal and outputting the error signal as the second signal.

5. The frequency modulator according to claim 4, wherein:
the generation section includes:
    a first storage section for storing a constant;
    a second selection section for outputting the error signal, which is processed by the loop filter, as the second signal when the input signal is inputted to the gain adjustment section; and reading the constant from the first storage section and outputting the constant as the second signal when the test signal is inputted to the gain adjustment section; and
    a calculation section for, when the test signal is inputted to the gain adjustment section and the constant is inputted to the voltage controlled oscillator, generating the first control information and the second control information based on the frequency width of the output frequency detected by the frequency detector; and
the calculation section generates the second control information such that the analog gain coefficient specified by the second control information is changed in accordance with the magnitude of the frequency width of the output frequency.

6. The frequency modulator according to claim 5, wherein prior to a process of generating the first control information, the calculation section temporarily sets the digital gain coefficient, which is specified by the first control information, to a predetermined value, and generates the second control information.

7. The frequency modulator according to claim 6, wherein the calculation section generates the first control information based on the frequency width of the test signal, the frequency width of the output frequency detected by the frequency detector, and the predetermined value.

8. The frequency modulator according to claim 4, wherein:
the voltage controlled oscillator is capable of switching an oscillation band of the oscillatory frequency;
the generation section includes:
    a first storage section for storing a constant;
    a second selection section for outputting the error signal, which is processed by the loop filter, as the second signal when the input signal is inputted to the gain adjustment section; and reading the constant from the first storage section and outputting the constant as the second signal when the test signal is inputted to the gain adjustment section;
    a second storage section for storing analog gain information in which oscillation bands selectable by the voltage controlled oscillator are associated with analog gain coefficients, respectively; and
    a calculation section for, when the test signal is inputted to the gain adjustment section and the constant is inputted to the voltage controlled oscillator, generating the first control information and the second control information based on the information regarding the state of the frequency modulation section; and
the calculation section reads, from the second storage section, an analog gain coefficient associated with an oscillation band that is currently selected by the voltage controlled oscillator, and generates the second control information for specifying this analog gain coefficient.

9. The frequency modulator according to claim 8, wherein:
the generation section includes a temperature detection section for detecting the temperature of the voltage controlled oscillator;
the second storage section stores the analog gain information per temperature; and
the calculation section reads, from the second storage section, an analog gain coefficient that is associated with the temperature detected by the temperature detection section and associated with the oscillation band that is currently selected by the voltage controlled oscillator, and generates the second control information for specifying this analog gain coefficient.

10. The frequency modulator according to claim 8, wherein the calculation section generates the second control information prior to a process of generating the first control information.

11. The frequency modulator according to claim 8, wherein the calculation section generates the first control information based on the frequency width of the test signal and the frequency width of the output frequency detected by the frequency detector.

12. The frequency modulator according to claim 4, wherein:
the generation section includes:
    a first storage section for storing a constant;
    a second selection section for outputting the error signal, which is processed by the loop filter, as the second signal when the input signal is inputted to the gain adjustment section; and reading the constant from the first storage section and outputting the constant as the second signal when the test signal is inputted to the gain adjustment section; and
    a calculation section for, when the test signal is inputted to the gain adjustment section and the constant is inputted to the voltage controlled oscillator, generating the first control information and the second control information based on the information regarding the state of the frequency modulation section; and
the calculation section generates the first control information and the second control information by substituting the frequency width of the output frequency, which is detected by the frequency detector, into a predetermined arithmetic expression including a digital gain coefficient and an analog gain coefficient as variables.

13. The frequency modulator according to claim 12, wherein:

the calculation section performs:
  a first process of temporarily setting the digital gain coefficient of the gain adjustment section to a first initial gain coefficient and temporarily setting the analog gain coefficient of the gain adjustment section to a second initial gain coefficient, before the test signal is inputted to the gain adjustment section and the constant is inputted to the voltage controlled oscillator; and
  a second process of substituting the first initial gain coefficient, the second initial gain coefficient, the frequency width of the test signal, and the frequency width of the output frequency, which is detected by the frequency detector, into the predetermined arithmetic expression to generate the first control information and the second control information, after the test signal is inputted to the gain adjustment section and the constant is inputted to the voltage controlled oscillator.

14. The frequency modulator according to claim 13, wherein, in the second process, the calculation section selects a combination of a digital gain coefficient and an analog gain coefficient that provides the minimum analog gain coefficient specified by the second control information, among a plurality of combinations of digital gain coefficients and analog gain coefficients that are obtained as solutions of the predetermined arithmetic expression, and generates the first control information and the second control information for specifying the selected analog gain coefficient and the selected digital gain coefficient.

15. A method for adjusting the gain of a frequency modulator comprising: a frequency modulation section for frequency-modulating an input signal and outputting a frequency-modulated signal; and a gain adjustment section for controlling the gain of the frequency modulation section in accordance with a digital gain coefficient specified by first control information and an analog gain coefficient specified by second control information, the method comprising the steps of:
  temporarily setting the analog gain coefficient and the digital gain coefficient of the gain adjustment section to predetermined values;
  generating a first test signal and inputting the first test signal to the gain adjustment section instead of the input signal;
  detecting an output frequency of the frequency-modulated signal with respect to the first test signal;
  generating the second control information based on the magnitude of the frequency width of the output frequency;
  generating a second test signal and inputting the second test signal to the gain adjustment section;
  detecting an output frequency of the frequency-modulated signal with respect to the second test signal; and
  generating the first control information based on the frequency width of the second test signal, the frequency width of the output frequency with respect to the second test signal, and the predetermined value of the digital gain coefficient.

16. A method for adjusting the gain of a frequency modulator comprising: a frequency modulation section for frequency-modulating an input signal and outputting a frequency-modulated signal, the frequency modulation section being capable of switching an oscillation band of an oscillatory frequency; and a gain adjustment section for controlling the gain of the frequency modulation section in accordance with a digital gain coefficient specified by first control information and an analog gain coefficient specified by second control information, the method comprising the steps of:
  reading, from a memory, an analog gain coefficient associated with an oscillation band that is currently selected by the frequency modulation section, and generating the second control information for specifying this analog gain coefficient;
  generating a second test signal and inputting the second test signal to the gain adjustment section instead of the input signal;
  detecting the output frequency of the frequency-modulated signal; and
  generating the first control information based on the frequency width of the second test signal and the frequency width of the output frequency.

17. A method for adjusting the gain of a frequency modulator comprising: a frequency modulation section for frequency-modulating an input signal and outputting a frequency-modulated signal, the frequency modulation section being capable of switching an oscillation band of an oscillatory frequency; and a gain adjustment section for controlling the gain of the frequency modulation section in accordance with a digital gain coefficient specified by first control information and an analog gain coefficient specified by second control information, the method comprising the steps of:
  detecting the temperature of the frequency modulation section;
  reading, from a memory, an analog gain coefficient that is associated with the temperature detected at the detecting step and associated with an oscillation band that is currently selected by the frequency modulation section, and generating the second control information for specifying this analog gain coefficient;
  generating a second test signal and inputting the second test signal to the gain adjustment section instead of the input signal;
  detecting the output frequency of the frequency-modulated signal; and
  generating the first control information based on the frequency width of the second test signal and the frequency width of the output frequency.

18. A method for adjusting the gain of a frequency modulator comprising: a frequency modulation section for frequency-modulating an input signal and outputting a frequency-modulated signal; and a gain adjustment section for controlling the gain of the frequency modulation section in accordance with a digital gain coefficient specified by first control information and an analog gain coefficient specified by second control information, the method comprising the steps of:
  temporarily setting the digital gain coefficient of the gain adjustment section to a first initial gain coefficient, and temporarily setting the analog gain coefficient of the gain adjustment section to a second initial gain coefficient;
  generating a first test signal and inputting the first test signal to the gain adjustment section instead of the input signal;
  detecting the output frequency of the frequency-modulated signal; and
  generating the first control information and the second control information by substituting the first initial gain coefficient, the second initial gain coefficient, the frequency width of the first test signal, and the frequency width of the output frequency into a predetermined arithmetic expression including a digital gain coefficient and an analog gain coefficient as variables.

* * * * *